US012684937B2

(12) United States Patent
Li et al.

(10) Patent No.: US 12,684,937 B2
(45) Date of Patent: Jul. 14, 2026

(54) LIGHT-EMITTING DEVICE AND METHOD OF MANUFACTURING THE SAME, DISPLAY SUBSTRATE

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Dong Li, Beijing (CN); Yichi Zhang, Beijing (CN)

(73) Assignees: BEIJING BOE TECHNOLOGY DEVELOPMENT CO., LTD., Beijing (CN); BOE TECHNOLOGY GROUP CO., LTD, Beijing (CN)

( * ) Notice: Subject to any disclaimer, the term of this patent is extended or adjusted under 35 U.S.C. 154(b) by 432 days.

(21) Appl. No.: 18/260,492

(22) PCT Filed: May 11, 2022

(86) PCT No.: PCT/CN2022/092294
§ 371 (c)(1),
(2) Date: Jul. 6, 2023

(87) PCT Pub. No.: WO2023/216158
PCT Pub. Date: Nov. 16, 2023

(65) Prior Publication Data
US 2025/0081721 A1 Mar. 6, 2025

(51) Int. Cl.
*H10K 50/16* (2023.01)
*H10K 50/115* (2023.01)
(Continued)

(52) U.S. Cl.
CPC ......... *H10K 50/166* (2023.02); *H10K 50/115* (2023.02); *H10K 50/156* (2023.02);
(Continued)

(58) Field of Classification Search
CPC ............... H10K 50/166; H10K 50/165; H10K 2101/40; H10K 2101/30; H10K 50/156; H10K 50/115; H10K 2102/331
See application file for complete search history.

(56) References Cited

U.S. PATENT DOCUMENTS

| | | | |
|---|---|---|---|
| 10,396,306 B2 | 8/2019 | Kim et al. | |
| 2019/0296257 A1* | 9/2019 | Palles-Dimmock ... | H10K 50/16 |

(Continued)

FOREIGN PATENT DOCUMENTS

| | | |
|---|---|---|
| CN | 109119542 A | 1/2019 |
| CN | 110556483 A | 12/2019 |

(Continued)

OTHER PUBLICATIONS

PCT International Search Report (w/ English translation) and Written Opinion for corresponding Application No. PCT/CN2022/092294, mailed Jan. 28, 2023, 10 pages.

(Continued)

*Primary Examiner* — David Vu
*Assistant Examiner* — Brandon C Fox
(74) *Attorney, Agent, or Firm* — Dority & Manning, P.A.

(57) ABSTRACT

A light-emitting device includes a first electrode, a second electrode, a light-emitting layer disposed between the first electrode and the second electrode, and a carrier functional layer disposed between the first electrode and the light-emitting layer. The carrier functional layer includes a first carrier functional layer and a second carrier functional layer, the first carrier functional layer is closer to the light-emitting layer than the second carrier functional layer, the first carrier functional layer contains a host material and a ligand material, the second carrier functional layer contains a host material, and the host material of the first carrier functional layer and the host material of the second carrier functional (Continued)

layer include same atoms. A mass fraction of the ligand material of the first carrier functional layer is greater than a mass fraction of a ligand material of the second carrier functional layer.

20 Claims, 15 Drawing Sheets

(51) Int. Cl.

| | |
|---|---|
| *H10K 50/15* | (2023.01) |
| *H10K 50/165* | (2023.01) |
| *H10K 101/30* | (2023.01) |
| *H10K 101/40* | (2023.01) |
| *H10K 102/00* | (2023.01) |

(52) U.S. Cl.
CPC ....... *H10K 50/165* (2023.02); *H10K 2101/30* (2023.02); *H10K 2101/40* (2023.02); *H10K 2102/331* (2023.02)

(56) References Cited

U.S. PATENT DOCUMENTS

| | | | |
|---|---|---|---|
| 2019/0326539 | A1 | 10/2019 | Chung et al. |
| 2021/0020838 | A1 | 1/2021 | Qin |
| 2021/0135139 | A1 | 5/2021 | Lee et al. |
| 2021/0257551 | A1 | 8/2021 | Yoon et al. |
| 2021/0399068 | A1 | 12/2021 | Kim et al. |
| 2022/0098479 | A1* | 3/2022 | Mei ...................... H10K 50/166 |
| 2022/0285644 | A1 | 9/2022 | Honda et al. |
| 2023/0074925 | A1 | 3/2023 | Zhang |
| 2023/0380206 | A1 | 11/2023 | Yamamoto et al. |
| 2024/0268137 | A1* | 8/2024 | Sakakibara .......... H10K 50/166 |

FOREIGN PATENT DOCUMENTS

| | | |
|---|---|---|
| CN | 112750954 A | 5/2021 |
| WO | WO2017106811 A1 | 6/2017 |
| WO | WO2020142480 A1 | 7/2020 |

OTHER PUBLICATIONS

Chen et al., "Shelf-Stable Quantum-Dot Light-Emitting Diodes with High Operational Performance", Advanced Materials, 2020, 10 pages.

Extended European Search Report for corresponding PCT Application No. PCT/CN2022092294, dated Feb. 12, 2025, 11 pages.

Extended European Search Report for corresponding Application No. 22941116, dated Feb. 12, 2025, 11 pages.

* cited by examiner

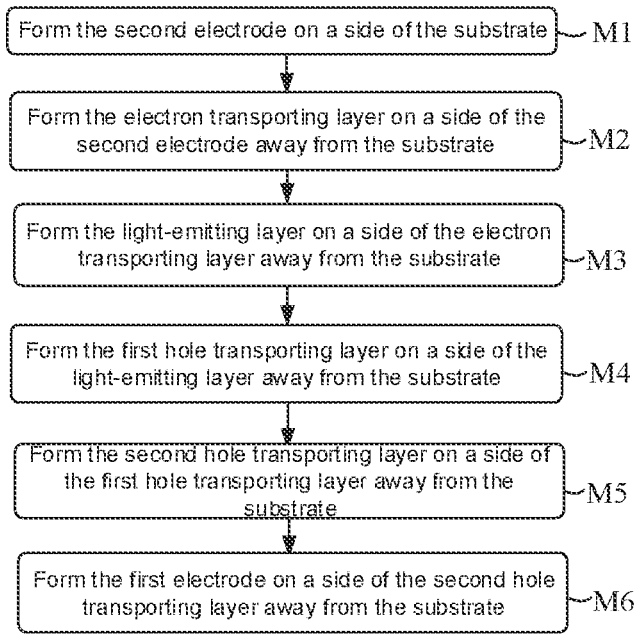

Form the second electrode on a side of the substrate — M1

Form the electron transporting layer on a side of the second electrode away from the substrate — M2

Form the light-emitting layer on a side of the electron transporting layer away from the substrate — M3

Form the first hole transporting layer on a side of the light-emitting layer away from the substrate — M4

Form the second hole transporting layer on a side of the first hole transporting layer away from the substrate — M5

Form the first electrode on a side of the second hole transporting layer away from the substrate — M6

FIG. 23

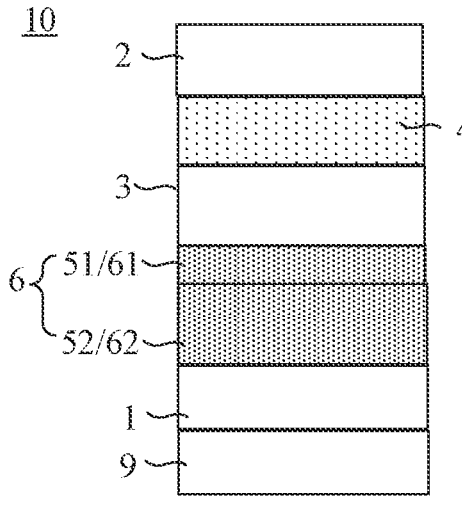

LIGHT-EMITTING DEVICE AND METHOD OF MANUFACTURING THE SAME, DISPLAY SUBSTRATE

CROSS-REFERENCE TO RELATED APPLICATION

This application is a national phase entry under 35 USC 371 of International Patent Application No. PCT/CN2022/092294, filed on May 11, 2022, which is incorporated herein by reference in its entirety.

TECHNICAL FIELD

The present disclosure relates to the field of display technologies, and in particular, to a light-emitting device and a method of manufacturing the same, and a display substrate.

BACKGROUND

Quantum dot light emitting diode (QLED) devices have attracted much attention in a display field due to their advantages of wide color gamut, self-luminescence, low starting voltage, quick response speed and the like. A working principle of a substrate of quantum dot light emitting diode device is that electrons and holes are respectively injected into two sides of a quantum dot light-emitting layer, and these electrons and holes recombine in the quantum dot light-emitting layer to form photons by which the quantum dot light emitting diode device eventually emits light.

SUMMARY

In an aspect, a light-emitting device is provided. The light-emitting device includes a first electrode, a second electrode, a light-emitting layer disposed between the first electrode and the second electrode, and a carrier functional layer disposed between the first electrode and the light-emitting layer. The carrier functional layer includes a first carrier functional layer and a second carrier functional layer, the first carrier functional layer is closer to the light-emitting layer than the second carrier functional layer, the first carrier functional layer contains a host material and a ligand material, the second carrier functional layer contains a host material, and the host material of the first carrier functional layer and the host material of the second carrier functional layer include same atoms. A mass fraction of the ligand material of the first carrier functional layer is greater than a mass fraction of a ligand material of the second carrier functional layer.

In some embodiments, the mass fraction of the ligand material of the second carrier functional layer is 10% to 80% of the mass fraction of the ligand material of the first carrier functional layer.

In some embodiments, the mass fraction of the ligand material of the first carrier functional layer is in a range from 5% to 50%, and the mass fraction of the ligand material of the second carrier functional layer is in a range from 0.5% to 40%.

In some embodiments, the ligand material of the first carrier functional layer is a first ligand, the ligand material of the second carrier functional layer is a second ligand, and a polarity of the first ligand and a polarity of the second ligand are opposite.

In some embodiments, a polarity of the light-emitting layer and the polarity of the first ligand are opposite.

In some embodiments, the ligand material of the first carrier functional layer is a first ligand, the first ligand includes a first sub-ligand and a second sub-ligand, and a material of the first sub-ligand and a material of the second sub-ligand are different.

In some embodiments, a polarity of the first sub-ligand and a polarity of the second sub-ligand are opposite.

In some embodiments, of the first carrier functional layer, a concentration of the ligand material contained in a side proximate to the light-emitting layer is greater than a concentration of the ligand material contained in a side away from the light-emitting layer.

In some embodiments, the ligand material of the second carrier functional layer is a second ligand, the material of the first sub-ligand and a material of the second ligand are the same, and the host material of the second carrier functional layer and the host material of the first carrier functional layer are the same.

In some embodiments, a mass fraction of the second sub-ligand of the first carrier functional layer and a mass fraction of the second ligand of the second carrier functional layer are equal.

In some embodiments, a number of carbon atoms of the first sub-ligand of the first carrier functional layer is in a range from 2 to 6.

In some embodiments, the first carrier functional layer contains a first ligand, and the mass fraction of the ligand material of the second carrier functional layer is 0.

In some embodiments, a surface roughness of the second carrier functional layer is in a range from 0.2 nm to 1.5 nm.

In some embodiments, the host material of the first carrier functional layer is nanoparticles, and a grain size of the nanoparticles is in a range from 3 nm to 5 nm.

In some embodiments, the first ligand of the first carrier functional layer and atoms of the host material of the first carrier functional layer have an adsorption force therebetween.

In some embodiments, a surface roughness of the host material of the first carrier functional layer is in a range from 0.5 nm to 2 nm.

In some embodiments, a ratio of a thickness of the first carrier functional layer to a thickness of the second carrier functional layer is in a range from 1:20 to 20:1.

In some embodiments, a thickness of the first carrier functional layer is less than a thickness of the second carrier functional layer.

In some embodiments, a sum of a thickness of the first carrier functional layer and a thickness of the second carrier functional layer is in a range from 20 nm to 60 nm.

In some embodiments, a thickness of the first carrier functional layer is in a range from 5 nm to 55 nm; a thickness of the second carrier functional layer is in a range from 5 nm to 55 nm.

In some embodiments, the ligand material of the first carrier functional layer and the ligand material of the second carrier functional layer each include any one of an organic ligand and an inorganic ligand.

In some embodiments, a material of the light-emitting layer is quantum dots.

In some embodiments, an energy level difference between the first carrier functional layer and the second carrier functional layer is greater than an energy level difference between the second carrier functional layer and the first electrode, and greater than an energy level difference between the first carrier functional layer and the light-emitting layer.

In some embodiments, the carrier functional layer is an electron transporting layer; the first carrier functional layer is a first electron transporting layer, and the second carrier functional layer is a second electron transporting layer. A lowest unoccupied molecular orbital (LUMO) energy level of the ligand material is greater than a LUMO energy level of a layer for forming the electron transporting layer.

In some embodiments, the LUMO energy level of the ligand material is greater than the LUMO energy level of the electron transporting layer by 1 eV or more.

In some embodiments, the same atoms included in the host material of the first carrier functional layer and the host material of the second carrier functional layer are an oxygen atom and a zinc atom.

In some embodiments, at least one of the first carrier functional layer and the second carrier functional layer further includes a dopant atom, and the dopant atom includes at least one of magnesium, aluminum, zirconium, hafnium and yttrium.

In some embodiments, the carrier functional layer is a hole transporting layer; the first carrier functional layer is a first hole transporting layer, the second carrier functional layer is a second hole transporting layer, and a highest occupied molecular orbital (HOMO) energy level of the ligand material is less than a HOMO energy level of a layer for forming the hole transporting layer.

In some embodiments, the HOMO energy level of the ligand material is less than the HOMO energy level of the hole transporting layer by 1 eV or more.

In some embodiments, the same atoms included in the host material of the first carrier functional layer and the host material of the second carrier functional layer are an oxygen atom, and any one of a nickel atom, a molybdenum atom, a tungsten atom, a vanadium atom and a zirconium atom.

In another aspect, a method of manufacturing a light-emitting device is provided. The method includes: forming a first electrode and a second electrode; forming a light-emitting layer between the first electrode and the second electrode; and forming a carrier functional layer located on a side of the first electrode. Forming the carrier functional layer located on the side of the first electrode includes: forming a first carrier functional layer and forming a second carrier functional layer. The first carrier functional layer is closer to the light-emitting layer than the second carrier functional layer, the first carrier functional layer contains a host material and a ligand material, the second carrier functional layer contains a host material, the host material of the first carrier functional layer and the host material of the second carrier functional layer include same atoms, and a mass fraction of the ligand material of the first carrier functional layer is greater than a mass fraction of a ligand material of the second carrier functional layer.

In some embodiments, forming the second carrier functional layer includes forming the second carrier functional layer by magnetron sputtering. Alternatively, forming the second carrier functional layer includes: forming a second solution; and performing any one of spin coating, ink jet printing and a sol-gel method by using the second solution to form the second carrier functional layer. The second solution contains a host material for forming the second carrier functional layer, and a mass fraction of a ligand material contained in the second solution is greater than or equal to 0.

In some embodiments, forming the first carrier functional layer includes: forming a first solution; and performing any one of spin coating, ink jet printing and a sol-gel method by using the first solution to form the first carrier functional layer. The first solution contains a host material for forming the first carrier functional layer, the first solution further contains a ligand material, and the mass fraction of the ligand material of the first carrier functional layer is greater than the mass fraction of the ligand material of the second carrier functional layer.

Alternatively, forming the first carrier functional layer includes: forming a third solution; performing any one of spin coating, ink jet printing and a sol-gel method by using the third solution to form an initial first carrier functional layer, the third solution containing a host material for forming the first carrier functional layer, the third solution further containing a ligand material, a mass fraction of the ligand material of the initial first carrier functional layer being equal to the mass fraction of the ligand material of the second carrier functional layer; and immersing the initial first carrier functional layer into a fourth solution to form the first carrier functional layer. The fourth solution is a solution containing a ligand material.

In some embodiments, forming the first carrier functional layer and the second carrier functional layer includes: forming an initial carrier functional layer; and immersing the initial carrier functional layer into a fifth solution, so that a portion, proximate to the fifth solution, of the immersed initial carrier functional layer forms a first carrier functional layer, and another portion of the immersed initial carrier functional layer forms the second carrier functional layer. The fifth solution is a solution containing a ligand material.

In yet another aspect, a display substrate is provided. The display substrate includes the light-emitting device as described above.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings in the following description may be regarded as schematic diagrams, and are not limitations on actual sizes of products, actual processes of methods and actual timings of signals involved in the embodiments of the present disclosure.

FIG. 23 is a flow diagram of yet another method of manufacturing a light-emitting device, in accordance with some embodiments of the present disclosure;

FIG. 24 is a structural diagram of yet another light-emitting device, in accordance with some embodiments of the present disclosure;

DETAILED DESCRIPTION

Figure 1A:
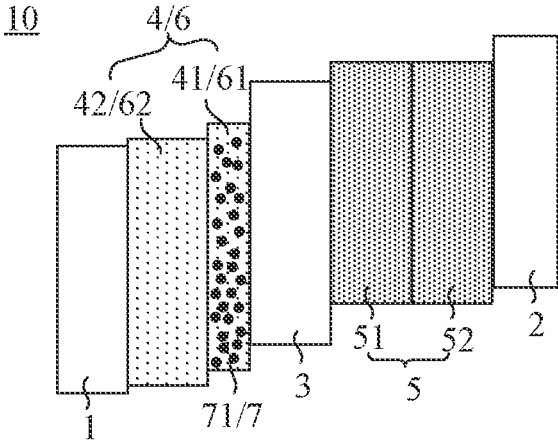
FIG. 1a is a structural diagram of a light-emitting device, in accordance with some embodiments of the present disclosure.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the specification and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "example". "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of" or "the plurality of" means two or more unless otherwise specified. In the description of some embodiments, the terms such as "coupled" and "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the content herein.

The phrase "at least one of A, B and C" has the same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term "if" is optionally construed as "when" or "in a case where" or "in response to determining that" or "in response to detecting", depending on the context. Similarly, depending on the context, the phrase "if it is determined that" or "if [a stated condition or event] is detected" is optionally construed as "in a case where it is determined that", "in response to determining that", "in a case where [the stated condition or event] is detected", or "in response to detecting [the stated condition or event]".

The phrase "applicable to" or "configured to" as used herein indicates an open and inclusive expression, which does not exclude devices that are applicable to or configured to perform additional tasks or steps.

Additionally, the phase "based on" as used herein is meant to be open and inclusive, since a process, a step, a calculation or other action that is "based on" one or more of stated conditions or values may, in practice, be based on additional conditions or values beyond those stated.

As used herein, the term such as "about", "substantially" or "approximately" includes a stated value and an average value within an acceptable range of deviation of a particular value. The acceptable range of deviation is determined by a person of ordinary skill in the art in view of measurement in question and errors associated with measurement of a particular quantity (i.e., limitations of a measurement system).

As used herein, the term such as "parallel", "perpendicular" or "equal" includes a stated condition and a condition similar to the stated condition, a range of the similar condition is within an acceptable range of deviation, and the acceptable range of deviation is determined by a person of ordinary skill in the art in view of measurement in question and errors associated with measurement of a particular quantity (i.e., limitations of a measurement system). For example, the term "parallel" includes absolute parallelism and approximate parallelism, and an acceptable range of deviation of the approximate parallelism may be, for example, a deviation within 5°; the term "perpendicular" includes absolute perpendicularity and approximate perpendicularity, and an acceptable range of deviation of the approximate perpendicularity may also be, for example, a deviation within 5°; the term "equal" includes absolute equality and approximate equality, and an acceptable range of deviation of the approximate equality may be that, for example, a difference between the two that are equal is less than or equal to 5% of either of the two.

It will be understood that, in a case where a layer or an element is referred to as being on another layer or a substrate, it may be that the layer or the element is directly on the another layer or the substrate, or there may be a middle layer between the layer or the element and the another layer or the substrate.

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown in a rectangular shape generally has a feature of being curved. Therefore, the regions shown in the accompanying drawings are schematic in nature, and their shapes are not intended to show actual shapes of regions in a device, and are not intended to limit the scope of the exemplary embodiments.

Quantum dots (QD), as a new luminescent material, have advantages of high purity of light, high luminous quantum efficiency, adjustable luminous color, long service life and the like, and have become a research hotspot of new light-emitting diode (LED) luminescent materials at present. Therefore, a quantum dot light emitting diode (QLED) in which a quantum dot material serves as a light-emitting layer has become a main research direction of new display apparatuses at present.

Active electroluminescent quantum dot light emitting diodes (MQLEDs) have attracted more and more attention due to their potential advantages of wide color gamut, long service life and the like. As a research on the MQLEDs is deepening day by day, a quantum efficiency is continuously improved, which basically reaches a level of industrialization, so that it is of great significance to further adopt new processes and technologies. Due to characteristics of the quantum dot material itself, a printing technology or a printing method is generally adopted, which may effectively improve a utilization rate of the material, so as to provide an efficient way for large-area manufacturing.

An efficiency and a service life of a light-emitting device are two important performance indexes of the light-emitting device. Factors affecting the efficiency of the light-emitting device include a fluorescence quantum yield of a QD layer, and a balance of carrier injection and a luminous efficiency of the light-emitting device. The higher the fluorescence quantum yield of the QD layer, the more balanced the carrier injection of the light-emitting device, the higher the luminous efficiency of the light-emitting device, and the more conducive it is to improving the efficiency of the light-emitting device. Factors affecting the service life of the light-emitting device mainly include a stability of each functional layer, the efficiency of the light-emitting device and a working voltage. The higher the stability of each functional layer, the higher the efficiency of the light-emitting device, the lower the working voltage, and the more conducive it is to improving the service life of the light-emitting device.

Figure 2:
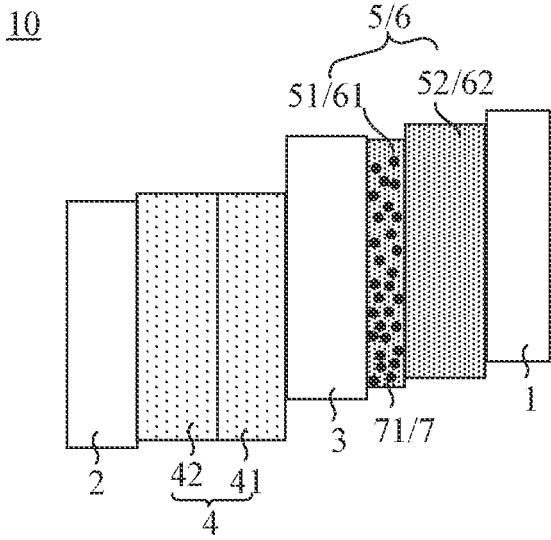
FIG. 2 is a structural diagram of another light-emitting device, in accordance with some embodiments of the present disclosure.

Based on this, the embodiments of the present disclosure provide a light-emitting device 10. As shown in FIGS. 1a and 2, the light-emitting device 10 includes a first electrode 1 and a second electrode 2, and further includes a light-emitting layer 3 disposed between the first electrode 1 and the second electrode 2, and a carrier functional layer 6 disposed between the first electrode 1 and the light-emitting layer 3. The carrier functional layer 6 includes a first carrier functional layer 61 and a second carrier functional layer 62, the first carrier functional layer 61 is closer to the light-emitting layer 3 than the second carrier functional layer 62, the first carrier functional layer 61 contains a host material and a ligand material 7, the second carrier functional layer 62 contains a host material, and the host material of the first carrier functional layer 61 and the host material of the second carrier functional layer 62 include same atoms. A mass fraction of the ligand material 7 of the first carrier functional layer 61 is greater than a mass fraction of a ligand material 7 of the second carrier functional layer 62.

As shown in FIGS. 1a and 2, the carrier functional layer 6 is a carrier transporting layer. For example, the carrier functional layer 6 is an electron transporting layer 4. Alternatively, the carrier functional layer 6 is a hole transporting layer 5.

It will be noted that a mass fraction of a ligand material 7 refers to a ratio of a mass of the ligand material 7 to a total mass of a film layer in which the ligand material 7 is located. For example, a mass fraction of the ligand material 7 of the first carrier functional layer 61 refers to a ratio of a mass of the ligand material 7 to a total mass of the first carrier functional layer 61; a mass fraction of the ligand material 7 of the second carrier functional layer 62 refers to a ratio of a mass of the ligand material 7 to a total mass of the second carrier functional layer 62. The description of the mass fraction of the ligand material 7 below will be understood in the same way.

As shown in FIG. 1a, the host material refers to a component mainly having a function of transporting respective carriers. For example, as for the electron transporting layer 4, a host material of $Zn_xM_1$-xO formed by sputtering refers to a zinc oxide film; a host material of $Zn_xM_1$-xO formed by spin coating or a sol-gel method refers to zinc oxide nanoparticles; where M refers to doped metal, and $0 \le x \le 1$. For example, as for the hole transporting layer 5, a host material of nickel oxide formed by spin coating or a sol-gel method refers to nickel oxide particles; a host material of vanadium pentoxide formed by spin coating or a sol-gel method refers to vanadium pentoxide particles; a host material of molybdenum oxide formed by spin coating or a sol-gel method refers to molybdenum oxide particles.

In some examples, as shown in FIG. 1a, the first electrode 1 may be a cathode, and thus the second electrode 2 is an anode. In this case, the first carrier functional layer 61 and the second carrier functional layer 62 may be each an electron transporting layer 4, and the same atoms included in the host material of the first carrier functional layer 61 and the host material of the second carrier functional layer 62 may be an oxygen atom and a zinc atom. That is, the first carrier functional layer 61 and the second carrier functional layer 62 may be two electron transporting layers 4 (i.e., a first electron transporting layer 41 and a second electron transporting layer 42) each formed of an inorganic material zinc oxide.

In a case where the first carrier functional layer 61 and the second carrier functional layer 62 are each the electron transporting layer 4, the first carrier functional layer 61 is the first electron transporting layer 41, the second carrier functional layer 62 is the second electron transporting layer 42, and the first electron transporting layer 41 is closer to the light-emitting layer 3 than the second electron transporting layer 42. The first electron transporting layer 41 contains the ligand material 7, and the second electron transporting layer 42 may not contain the ligand material 7. The mass fraction of the ligand material 7 of the first electron transporting layer 41 is greater than the mass fraction of the ligand material 7 of the second carrier functional layer 62.

It will be understood that the second electron transporting layer 42 may not contain the ligand material 7, which still satisfies the requirement that the mass fraction of the ligand material 7 of the first electron transporting layer 41 is greater than the mass fraction of the ligand material 7 of the second carrier functional layer 62.

It will be noted that, in addition to the oxygen atom and the zinc atom, the host material of each of the first carrier functional layer 61 and the second carrier functional layer 62 may further include a dopant atom, which will be described in detail below and not be repeated here.

In some examples, as shown in FIG. 2, the first electrode 1 may be an anode, and thus the second electrode 2 is a cathode. In this case, the first carrier functional layer 61 and the second carrier functional layer 62 may be each a hole transporting layer 5, and the same atoms included in the host material of the first carrier functional layer 61 and the host material of the second carrier functional layer 62 may be an oxygen atom and a nickel atom. That is, the first carrier functional layer 61 and the second carrier functional layer 62 may be two hole transporting layers 5 (i.e., a first hole transporting layer 51 and a second hole transporting layer 52) each formed of an inorganic material nickel oxide.

In a case where the first carrier functional layer 61 and the second carrier functional layer 62 are each the hole transporting layer 5, the first carrier functional layer 61 is the first hole transporting layer 51, the second carrier functional layer 62 is the second hole transporting layer 52, and the first hole transporting layer 51 is closer to the light-emitting layer 3 than the second hole transporting layer 52. The first hole transporting layer 51 contains the ligand material 7, and the second hole transporting layer 52 contains the ligand material 7, which is not limited thereto. The mass fraction of the ligand material 7 of the first hole transporting layer 51 is greater than the mass fraction of the ligand material 7 of the second hole transporting layer 52.

It will be understood that the second hole transporting layer 52 may not contain the ligand material 7, which satisfies the requirement that the mass fraction of the ligand material 7 of the first hole transporting layer 51 is greater than the mass fraction of the ligand material 7 of the second hole transporting layer 52.

It will be noted that the same atoms included in the host material of the first carrier functional layer 61 and the host material of the second carrier functional layer 62 may be the oxygen atom and the nickel atom, or may be other atoms of a material for forming the hole transporting layer 5, which will be described in detail below and not be repeated here.

It will be noted that in FIGS. 1a and 2, patterns of black dots are used for representing the ligand material 7, which only illustrates a film layer where the ligand material 7 is located, and does not have any limitation on a structure, a mass or a size of the ligand material 7. The same is true for the following drawings.

As shown in FIG. 1a, the light-emitting device 10 may be provided with two hole transporting layers 5, e.g., a first hole transporting layer 51 and a second hole transporting layer 52. The first hole transporting layer 51 is proximate to the light-emitting layer 3, and a highest occupied molecular orbital (HOMO) energy level of the first hole transporting layer 51 is deeper than a HOMO energy level of the second hole transporting layer 52. The HOMO energy level of the first hole transporting layer 51 is in a range from −5.9 eV to −5.6 eV, inclusive. The material of the first hole transporting layer 51 may be any one of 4,4',4'-Tris(carbazol-9-yl)-triphenylamine (TCTA), 4,4'-cyclohexylidenebis [N,N-bis (p-tolyl) aniline] (TAPC) and Poly(N-vinylcarbazole) (PVK). The second hole transporting layer 52 is farther away from the light-emitting layer 3 than the first hole transporting layer 51, and the HOMO energy level of the second hole transporting layer 52 is shallower than the HOMO energy level of the first hole transporting layer 51. The HOMO energy level of the second hole transporting layer 52 is in a range from −5.5 eV to −5.2 eV, inclusive. The material of the second hole transporting layer 52 may be any one of N,N'-Di-[(1-naphthalenyl)-N,N'-diphenyl]-1,1'-bi-phenyl)-4,4'-diamine (NPB), 4,4',4"-Tris(N-3-methylphe-nyl-N-phenylamino)triphenylamine (m-MTDATA) and 1,2, 4,5-Tetrakis(trifluoromethyl)benzene (TFB).

As shown in FIG. 2, the light-emitting device 10 is provided with two hole transporting layers 5 that are the first hole transporting layer 51 and the second hole transporting layer 52. The first hole transporting layer 51 is proximate to the light-emitting layer 3, and the HOMO energy level of the first hole transporting layer 51 is relatively deep. The HOMO energy level of the first hole transporting layer 51 is in a range from −6.2 eV to −5.7 eV, inclusive. The material of the first hole transporting layer 51 may be molybdenum oxide ($MoO_x$). The second hole transporting layer 52 is farther away from the light-emitting layer 3 than the first hole transporting layer 51, and the HOMO energy level of the second hole transporting layer 52 is relatively shallow. The HOMO energy level of the second hole transporting layer 52 is in a range from −5.7 eV to −5.2 eV, inclusive. The material of the second hole transporting layer 52 may be any one of vanadium pentoxide ($V_2O_5$) and nickel oxide ($NiO_x$).

For example, in a case where the ligand material 7 is included in the hole transporting layer 5, there may be one hole transporting layer 5 in the light-emitting device 10, a HOMO energy level of the hole transporting layer 5 is in a range from −6.2 eV to −5.2 eV, inclusive, and a material of the hole transporting layer 5 may be any one of $MoO_x$, $V_2O_5$ and $NiO_x$.

It will be noted that in a case where the carrier functional layer 6 includes the first carrier functional layer 61 and the second carrier functional layer 62, and the host material included in the first carrier functional layer 61 and the host material included in the second carrier functional layer 62 are each nanoparticles, a grain size of the nanoparticles of the host material of the first carrier functional layer 61 may be different from a grain size of the nanoparticles of the host material of the second carrier functional layer 62.

Performance of the formed light-emitting device 10 in which the mass fraction of the ligand material 7 of the first carrier functional layer 61 is greater than the mass fraction of the ligand material 7 of the second carrier functional layer 62 will be described below.

Figure 1B:
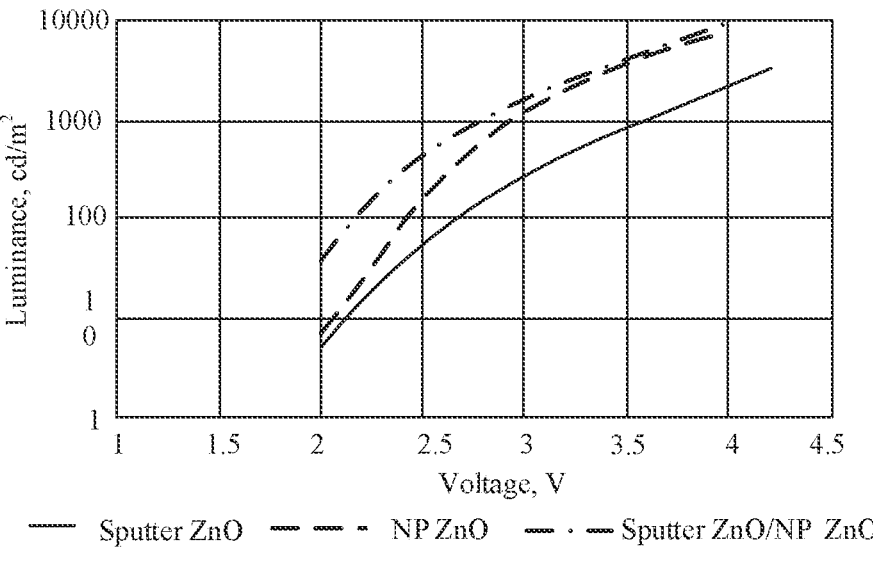
FIG. 1b is a curve diagram showing a variation in luminance of a light-emitting device with voltage, in accordance with some embodiments of the present disclosure.
Figure 1C:
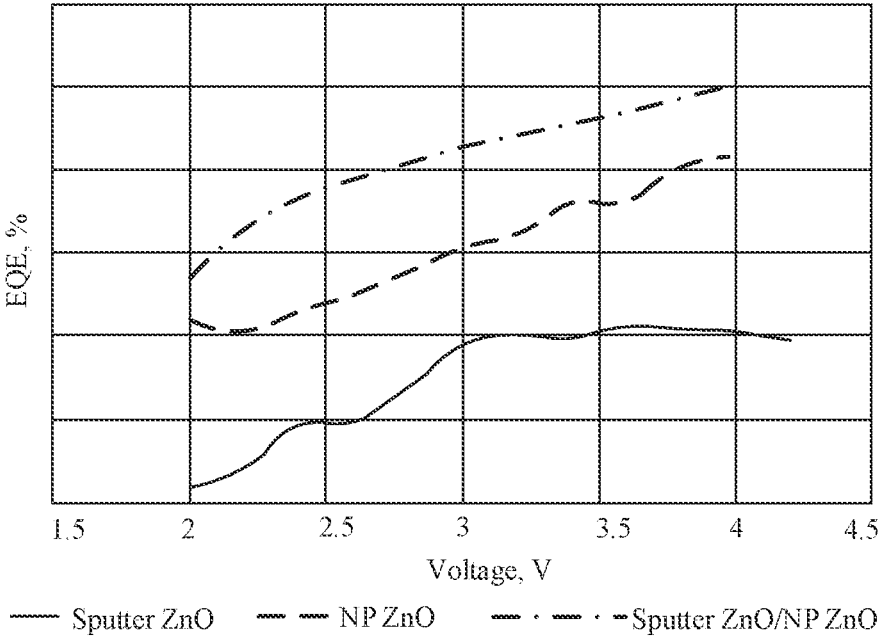
FIG. 1c is a curve diagram showing a variation in an external quantum efficiency (EQE) of a light-emitting device with voltage, in accordance with some embodiments of the present disclosure.
Figure 1D:
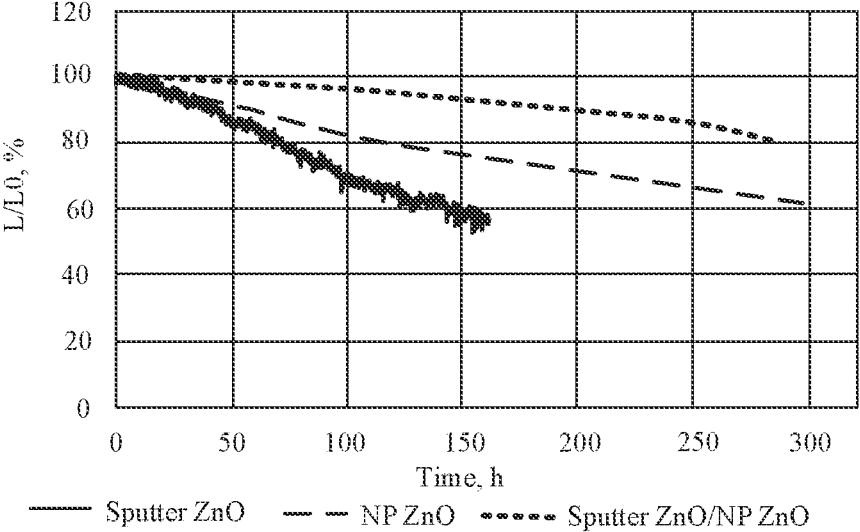
FIG. 1d is a curve diagram showing a decay of luminance of a light-emitting device with time, in accordance with some embodiments of the present disclosure.

In some examples, as shown in Table 1 and FIGS. 1b, 1c and 1d, the formed first carrier functional layer 61 (i.e., the first electron transporting layer 41) in the figures is represented by ZnO, and QD represents the quantum dot light-emitting layer. ZnO NP represents the first electron transporting layer 41 formed of the ZnO nanoparticles, the first electron transporting layer 41 contains the ligand material 7, and the first electron transporting layer 41 may be obtained by any one of spin coating and ink jet printing. ZnO sol-gel represents the first electron transporting layer 41 obtained by the sol-gel method, and the first electron transporting layer 41 contains the ligand material 7. ZnO Sputter represents the ZnO film obtained by magnetron sputtering.

TABLE 1

| values of photoluminescence quantum yields (PLQYs) of light-emitting devices | | |
|---|---|---|
| Film | Quantum dot PLQY (400 nm excitation) | Average value X |
| Single QD | 0.638, 0.646 | 0.642 |
| ZnO NP + QD | 0.539, 0.536 | 0.5375 |
| ZnO sol-gel + QD | 0.517, 0.508 | 0.5125 |
| ZnO Sputter + QD | 0.507, 0.396 | 0.4515 |

In Table 1, Quantum dot PLQY represents the photoluminescence quantum yield. The greater the numerical value of the photoluminescence quantum yield, the greater the quantum yield of the light-emitting device 10. In Table 1, the quantum yields PLQY are each two values, e.g., 0.638 and 0.646 with an average value X of 0.642. By comparing the numerical values X of the quantum yields of the light-emitting devices 10 each including a different electron transporting layer 4, it can be seen that, on the quantum yield PLQY of QD, an influence of ZnO NP is the smallest, followed by an influence of ZnO sol-gel, and an influence of ZnO Sputter is the largest, which is because the first electron transporting layer 41 formed of ZnO nanoparticles has a relatively large content of ligand materials 7 of which a passivation effect on a surface of the first electron transporting layer 41 is relatively strong, and a quenching effect on QD is relatively weak.

The ligand material 7 has an effect of passivating a surface defect of a film layer. That is, as long as there is the ligand material 7, there must be the passivation effect. The greater the content (the mass fraction) of the ligand material 7, the more obvious the passivation effect. However, the greater the content of the ligand material 7, the weaker the conductivity of the film layer. Therefore, there is a need to reasonably adjust the content (i.e. the mass fraction) of the ligand material 7.

It will be noted that, in Table 1, only an influence, on the PLQY, of the first electron transporting layer 41 adjacent to QD is shown, and that of other film layers are not shown. As for two electron transporting layers 4, only a first electron transporting layer 41 in contact with QD is considered.

It can be seen therefrom that the ligand material 7 contained in the first electron transporting layer 41 may adjust an electron mobility of the electron transporting layer 4, thereby adjusting a charge balance of the light-emitting device 10.

In FIG. 1b, Sputter ZnO/NP ZnO represents that the second electron transporting layer 42 is ZnO Sputter, the first electron transporting layer 41 is ZnO NP, and the first electron transporting layer 41 contains the ligand material 7; in this case, the film structures of the light-emitting device 10 may include the first electrode 1, the second electron transporting layer 42, the first electron transporting layer 41, the light-emitting layer 3, the hole transporting layer 5 and the second electrode 2. NP ZnO represents a single electron transporting layer 4 formed of ZnO nanoparticles; in this case, the film structures of the light-emitting device 10 may include the first electrode 1, the electron transporting layer 4, the light-emitting layer 3, the hole transporting layer 5 and the second electrode 2. Sputter ZnO represents a single electron transporting layer 4 formed of ZnO Sputter; in this case, the film structures of the light-emitting device 10 may include the first electrode 1, the electron transporting layer 4, the light-emitting layer 3, the hole transporting layer 5 and the second electrode 2.

It can be seen from FIG. 1b that, in a case where the electron transporting layer 4 includes two layers that are Sputter ZnO and NP ZnO, and the first electron transporting layer 41 contains the ligand material 7, luminance of the light-emitting device 10 is the highest, and a turn-on voltage thereof is less than 2 V. This indicates that the electron transporting layer 4 is provided to be two layers, and the first electron transporting layer 41 contains the ligand material 7, which enables the light-emitting device 10 to have a relatively large number of injected carriers, so that there are a relatively large number of generated excitons. Thus, radiation recombination occurs relatively often, so that a relatively large number of photons are released.

In FIG. 1c, the structures of the light-emitting devices 10 respectively represented by Sputter ZnO/NP ZnO, NP ZnO and Sputter ZnO are as described above, which will not be repeated here. EQE represents an external quantum efficiency of a light-emitting device 10. It can be seen that, in the case where the electron transporting layer 4 includes two layers that are Sputter ZnO and NP ZnO, and the first electron transporting layer 41 contains the ligand material 7, the external quantum efficiency of the light-emitting device 10 is the highest. That is, the luminance, under a unit current, is high, which means that injected charges emit light more effectively, less non-radiative recombination is generated or generated photons are confined in the light-emitting device 10 and cannot leave the light-emitting device 10. As a result, the luminous efficiency of the light-emitting device 10 is higher.

In FIG. 1*d*, the structures of the light-emitting devices 10 respectively represented by Sputter ZnO/NP ZnO, NP ZnO and Sputter ZnO are as described above, which will not be repeated here. L0 represents initial luminance of a light-emitting device 10, which may be regarded as 100%. FIG. 1*d* shows a time required for luminance to decay from 100% to 95% (or a certain constant percentage such as 70% or 50%) under a same current (that is, the light-emitting device 10 is driven by current). In general, the longer the required time, the longer the service life of the light-emitting device 10, and the more stable the light-emitting device 10.

Therefore, in the case where the electron transporting layer 4 includes two layers that are Sputter ZnO and NP ZnO, and the first electron transporting layer 41 contains the ligand material 7, the service life of the light-emitting device 10 is relatively long.

It will be noted that, in general, in a case where a factor of the stability of the material itself is excluded, the higher the luminous efficiency of the light-emitting device 10, the higher the luminance under the same current. It will be understood that, if the luminance is same, a high-efficiency light-emitting device 10 requires a small current, which has a small damage to the light-emitting device 10, so that the service life will be relatively long. Moreover, if the light-emitting device 10 has a relatively small working voltage, the service life will be long.

In the embodiments of the present disclosure, the first carrier functional layer 61 and the second carrier functional layer 62 having the different contents of the ligand materials 7 are provided. The ligand material 7 may reduce a value of an energy level difference between the first carrier functional layer 61 and the light-emitting layer 3, so as to adjust energy levels and carrier mobilities of the first carrier functional layer 61 and the second carrier functional layer 62. For example, an existence of the ligand material 7 of the electron transporting layer 4 may cause a distance between ZnO nanoparticles or ZnO crystal lattices to increase, which affects electron transportation, so that it is conducive to adjusting a balance of carrier (electron) transportation. For example, the first electron transporting layer 41 contains the ligand material 7, which is conducive to reducing an electron injection barrier; the first hole transporting layer 51 contains the ligand material 7, which is conducive to reducing a hole injection barrier. Thus, it is conducive to reducing the working voltage of the light-emitting device 10, and prolonging the service life of the light-emitting device 10.

Moreover, in the embodiments of the present disclosure, the host material of the first carrier functional layer 61 and the host material of the second carrier functional layer 62 include the same atoms, and the energy level and the carrier mobility of the film layer where the ligand material 7 is located are adjusted only by the content of the ligand material 7. Thus, a material preparation cost is relatively low, a material compatibility of the two layers is good, and interface defects are relatively few.

It will be noted that, in a case where the carrier functional layer 6 is the electron transporting layer 4, the hole transporting layer 5 may be provided to be one layer or two layers; in a case where the carrier functional layer 6 is the hole transporting layer 5, the electron transporting layer 4 may be provided to be one layer or two layers. In the light-emitting device 10 shown in FIGS. 1*a* and 2, the hole transporting layer 5 and the electron transporting layer 4 are each provided to be two layers for illustration, which is not a limitation to the structure of the light-emitting device 10. The same is true for the following.

Figure 3:
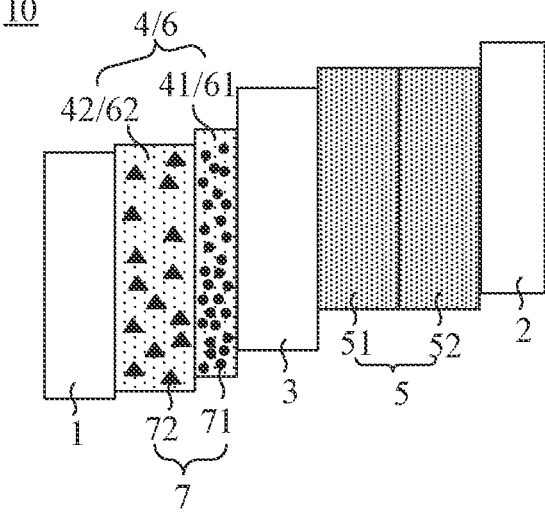
FIG. 3 is a structural diagram of yet another light-emitting device, in accordance with some embodiments of the present disclosure.
Figure 4:
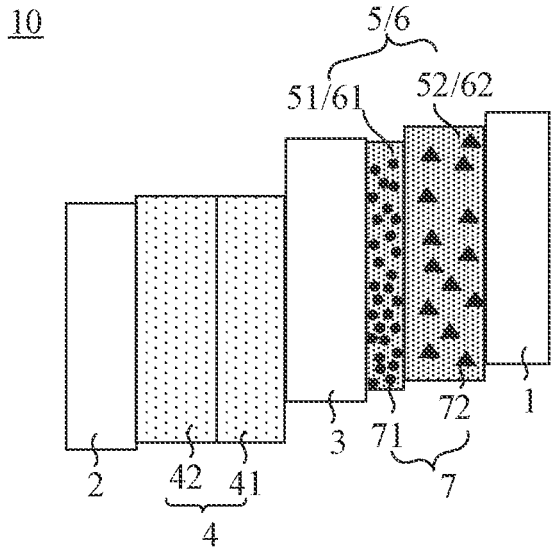
FIG. 4 is a structural diagram of yet another light-emitting device, in accordance with some embodiments of the present disclosure.

In some embodiments, as shown in FIGS. 3 and 4, the mass fraction of the ligand material 7 of the second carrier functional layer 62 is 10% to 80% of the mass fraction of the ligand material 7 of the first carrier functional layer 61.

In some examples, as shown in FIG. 3, the first carrier functional layer 61 is the first electron transporting layer 41, and the second carrier functional layer 62 is the second electron transporting layer 42. The mass fraction of the ligand material 7 contained in the second electron transporting layer 42 is 10%, 20%, 40%, 50%, 65% or 80% of the mass fraction of the ligand material 7 of the first electron transporting layer 41, which is not limited thereto.

In some examples, as shown in FIG. 4, the first carrier functional layer 61 is the first hole transporting layer 51, and the second carrier functional layer 62 is the second hole transporting layer 52. The mass fraction of the ligand material 7 contained in the second hole transporting layer 52 is 10%, 18%, 35%, 48%, 70% or 80% of the mass fraction of the ligand material 7 of the first hole transporting layer 51, which is not limited thereto.

The second carrier functional layer 62 is provided with the ligand material 7, so that it is possible to effectively adjust an energy level difference between the first electrode 1 and the second carrier functional layer 62. The first carrier functional layer 61 and the second carrier functional layer 62 are each provided with the ligand material 7, and the mass fraction of the ligand material 7 of the first carrier functional layer 61 is greater than the mass fraction of the ligand material 7 of the second carrier functional layer 62. Thus, in the case where the carrier functional layer 6 is the electron transporting layer 4, energy levels of film layers decrease in a stepwise manner in a direction from the light-emitting layer 3 to the first electrode 1, which facilitates the electron injection into the light-emitting layer 3, so that the electron mobility is improved; in the case where the carrier functional layer 6 is the hole transporting layer 5, the energy levels of the film layers increase in a stepwise manner in the direction from the light-emitting layer 3 to the first electrode 1, which facilitates the hole injection into the light-emitting layer 3, so that the hole mobility is improved. As a result, the working voltage of the light-emitting device 10 is reduced.

In some embodiments, the mass fraction of the ligand material 7 of the first carrier functional layer 61 is in a range from 5% to 50%, and the mass fraction of the ligand material 7 of the second carrier functional layer 62 is in a range from 0.5% to 40%.

In some examples, as shown in FIG. 3, the first carrier functional layer 61 is the first electron transporting layer 41, the second carrier functional layer 62 is the second electron transporting layer 42, and the first electron transporting layer 41 and the second electron transporting layer 42 each contain the ligand material 7. In a case where a condition that the mass fraction of the ligand material 7 of the second electron transporting layer 42 is 10% to 80% of the mass fraction of the ligand material 7 of the first electron transporting layer 41 is satisfied, the mass fraction of the ligand material 7 of the first electron transporting layer 41 is 5%, 8%, 15%, 20%, 25%, 30%, 45% or 50%, which is not limited here; the mass fraction of the ligand material 7 of the second electron transporting layer 42 is 0.5%, 3%, 10%, 20%, 25%, 30%, 35% or 40%, which is not limited here.

In some examples, as shown in FIG. 4, the first carrier functional layer 61 is the first hole transporting layer 51, the second carrier functional layer 62 is the second hole transporting layer 52, and the first hole transporting layer 51 and the second hole transporting layer 52 each contain the ligand material 7. In a case where a condition that the mass fraction of the ligand material 7 contained in the second hole transporting layer 52 is 10% to 80% of the mass fraction of the ligand material 7 of the first hole transporting layer 51 is satisfied, the mass fraction of the ligand material 7 of the first hole transporting layer 51 is 5%, 9%, 16%, 22%, 28%, 35%, 46% or 50%, which is not limited here; the mass fraction of the ligand material 7 of the second hole transporting layer 52 is 0.5%, 5%, 12%, 18%, 23%, 28%, 36% or 40%, which is not limited here.

In some embodiments, as shown in FIGS. 3 to 6, the ligand material 7 of the first carrier functional layer 61 is a first ligand 71, the ligand material 7 of the second carrier functional layer 62 is a second ligand 72, and a polarity of the first ligand 71 and a polarity of the second ligand 72 are opposite.

It will be noted that a description that polarities of two ligand materials 7 are opposite may be understood that properties of hydrophilicity-hydrophobicity of the two ligand materials 7 are opposite. A polar system is hydrophilic, and a non-polar system is oleophilic. The property of hydrophilicity-hydrophobicity may be each determined by a contact angle. In general, a contact angle less than 60 degrees is referred to as a hydrophilic contact angle, and a contact angle greater than 60 degrees is referred to as a hydrophobic contact angle. The less the contact angle, the better the wettability, which means that the ligand material is hydrophilic. Moreover, in the accompanying drawings, the ligand material 7 having a different polarity is illustrated by adopting a different shape, and parameters, such as a shape, a structure and a mass, of the ligand material 7 are not limited.

For example, the ligand materials 7 with the opposite polarities include a hydrophilic ligand and a hydrophobic ligand, respectively. For example, a terminal of the hydrophilic ligand contains a group such as mercaptopropionic acid or ethanolamine, and in this case, a film layer containing the hydrophilic ligand has a relatively strong polarity, and has a water solubility or an alcohol solubility; a terminal of the hydrophobic ligand contains alkyl thioalcohol, alkylamine, aniline or thiophenol, and in this case, a film layer containing the hydrophobic ligand has a relatively weak polarity, and has an oil solubility.

In some examples, as shown in FIG. 3, the first carrier functional layer 61 is the first electron transporting layer 41, and the second carrier functional layer 62 is the second electron transporting layer 42; the ligand material 7 of the first electron transporting layer 41 is the first ligand 71, and the first ligand 71 may be a hydrophilic ligand; the ligand material 7 of the second electron transporting layer 42 is the second ligand 72, and the second ligand 72 may be a hydrophobic ligand. The first electron transporting layer 41 is hydrophilic, the second electron transporting layer 42 is hydrophobic, and the polarities of the first electron transporting layer 41 and the second electron transporting layer 42 are opposite.

Figure 5:
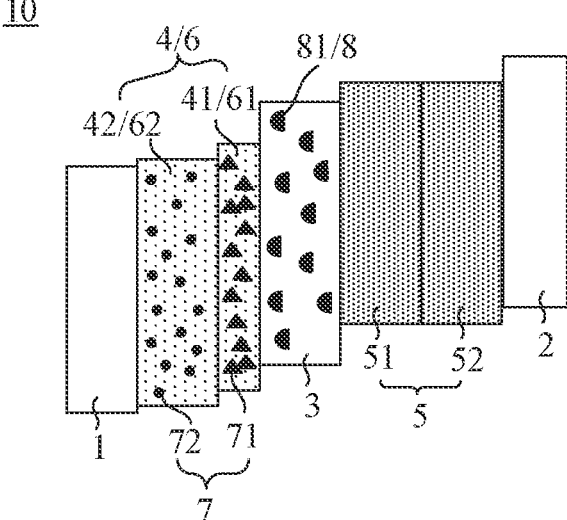
FIG. 5 is a structural diagram of yet another light-emitting device, in accordance with some embodiments of the present disclosure.

In some examples, as shown in FIG. 5, the first carrier functional layer 61 is the first electron transporting layer 41, and the second carrier functional layer 62 is the second electron transporting layer 42; the ligand material 7 of the first electron transporting layer 41 is the first ligand 71, and the first ligand 71 may be a hydrophobic ligand; the ligand material 7 of the second electron transporting layer 42 is the second ligand 72, and the second ligand 72 may be a hydrophilic ligand. The first electron transporting layer 41 is hydrophobic, the second electron transporting layer 42 is hydrophilic, and the polarities of the first electron transporting layer 41 and the second electron transporting layer 42 are opposite.

In some examples, as shown in FIG. 4, the first carrier functional layer 61 is the first hole transporting layer 51, and the second carrier functional layer 62 is the second hole transporting layer 52; the ligand material 7 of the first hole transporting layer 51 is the first ligand 71, and the first ligand 71 may be a hydrophilic ligand; the ligand material 7 of the second hole transporting layer 52 is the second ligand 72, and the second ligand 72 may be a hydrophobic ligand. The first hole transporting layer 51 is hydrophilic, the second hole transporting layer 52 is hydrophobic, and the polarities of the first hole transporting layer 51 and the second hole transporting layer 52 are opposite.

Figure 6:
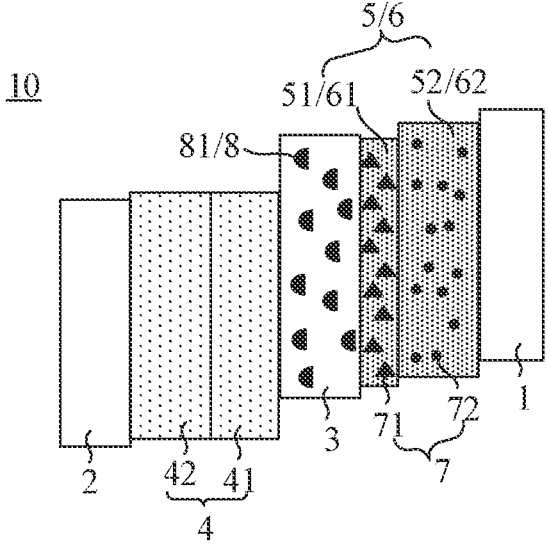
FIG. 6 is a structural diagram of yet another light-emitting device, in accordance with some embodiments of the present disclosure.

In some examples, as shown in FIG. 6, the first carrier functional layer 61 is the first hole transporting layer 51, and the second carrier functional layer 62 is the second hole transporting layer 52; the ligand material 7 of the first hole transporting layer 51 is the first ligand 71, and the first ligand 71 may be a hydrophobic ligand; the ligand material 7 of the second hole transporting layer 52 is the second ligand 72, and the second ligand 72 may be a hydrophilic ligand. The first hole transporting layer 51 is hydrophobic, the second hole transporting layer 52 is hydrophilic, and the polarities of the first hole transporting layer 51 and the second hole transporting layer 52 are opposite.

It will be noted that the ligand material 7 in the first carrier functional layer 61 is the first ligand 71, and the first ligand 71 may be the hydrophobic ligand or the hydrophilic ligand; the ligand material 7 in the second carrier functional layer 62 is the second ligand 72, and the second ligand 72 may be the hydrophobic ligand or the hydrophilic ligand. That is, as for the same ligand material 7, it is the first ligand 71 in a case where it is in the first carrier functional layer 61, and it is the second ligand 72 in a case where it is in the second carrier functional layer 62; the first ligand 71 and the second ligand 72 are named according to a positional relationship.

The polarities of the first carrier functional layer 61 and the second carrier functional layer 62 are different, which may ensure that interfaces will not be destroyed due to mutual dissolution between the first carrier functional layer 61 and the second carrier functional layer 62 during a deposition process, thereby preventing the performance of the light-emitting device 10 from being affected.

In some embodiments, as shown in FIGS. 5 to 8, a polarity of the light-emitting layer 3 and the polarity of the first ligand 71 are opposite.

For example, the light-emitting layer 3 may be a hydrophilic light-emitting layer. That is, the light-emitting layer 3 has a water solubility. For example, the light-emitting layer 3 may be made of quantum dots of which surfaces are each bonded to a water-soluble ligand. The light-emitting layer 3 further contains a ligand 8 such as alcoholamine or amino carboxylic acid; amino on a terminal of the ligand 8 is used for coordination, and oxhydryl and carboxyl that are exposed outwards on the other terminal of the ligand 8 are hydrophilic groups. The ligand 8 may be represented as a ligand 81.

For example, the light-emitting layer 3 may be a hydrophobic light-emitting layer. That is, the light-emitting layer 3 has an oil solubility. For example, the light-emitting layer 3 may be made of quantum dots of which surfaces are each bonded to an oil-soluble organic ligand. The light-emitting layer 3 further contains a ligand 8 such as alkylamine or aromatic amine; amino on a terminal of the ligand 8 is used for coordination, and groups that are exposed outwards on the other terminal of the ligand 8 are alkyl and aryl that are oleophilic. Thus, the system is oleophilic, and is represented as a ligand 82.

It will be noted that a bonding force between the light-emitting layer 3 and the ligand 8 thereof is relatively strong, and the polarity of the light-emitting layer 3 is opposite to that of the first carrier functional layer 61, so that it is possible to effectively prevent the ligand material 7 of the first carrier functional layer 61 from detaching.

In some examples, as shown in FIG. 5, the first carrier functional layer 61 is the first electron transporting layer 41, and the second carrier functional layer 62 is the second electron transporting layer 42; the ligand material 7 of the first electron transporting layer 41 is the first ligand 71, and the first ligand 71 may be the hydrophobic ligand; the ligand material 7 of the second electron transporting layer 42 is the second ligand 72, and the second ligand 72 may be the hydrophilic ligand. In this case, the first electron transporting layer 41 is hydrophobic, the second electron transporting layer 42 is hydrophilic, and the light-emitting layer 3 may be the hydrophilic light-emitting layer. The polarities of the first electron transporting layer 41 and the light-emitting layer 3 are opposite.

In some examples, as shown in FIG. 6, the first carrier functional layer 61 is the first hole transporting layer 51, and the second carrier functional layer 62 is the second hole transporting layer 52; the ligand material 7 of the first hole transporting layer 51 is the first ligand 71, and the first ligand 71 may be the hydrophobic ligand; the ligand material 7 of the second hole transporting layer 52 is the second ligand 72, and the second ligand 72 may be the hydrophilic ligand. In this case, the first hole transporting layer 51 is hydrophobic, the second hole transporting layer 52 is hydrophilic, and the light-emitting layer 3 may be the hydrophilic light-emitting layer. The polarities of the first hole transporting layer 51 and the light-emitting layer 3 are opposite.

Figure 7:
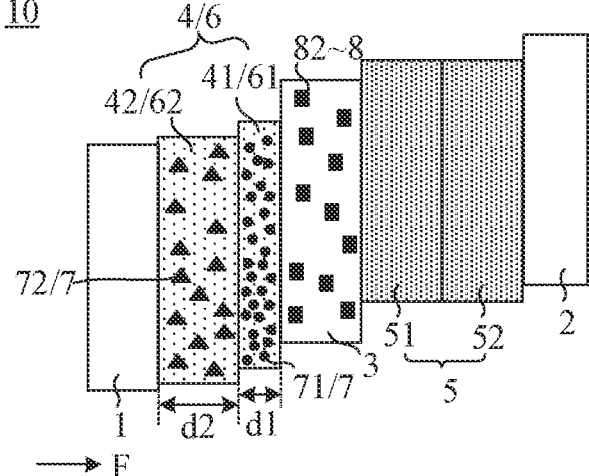
FIG. 7 is a structural diagram of yet another light-emitting device, in accordance with some embodiments of the present disclosure.

In some examples, as shown in FIG. 7, the first carrier functional layer 61 is the first electron transporting layer 41, and the second carrier functional layer 62 is the second electron transporting layer 42; the ligand material 7 of the first electron transporting layer 41 is the first ligand 71, and the first ligand 71 may be the hydrophilic ligand; the ligand material 7 of the second electron transporting layer 42 is the second ligand 72, and the second ligand 72 may be the hydrophobic ligand. In this case, the first electron transporting layer 41 is hydrophilic, the second electron transporting layer 42 is hydrophobic, and the light-emitting layer 3 may be the hydrophobic light-emitting layer. The polarities of the first electron transporting layer 41 and the light-emitting layer 3 are opposite.

Figure 8:
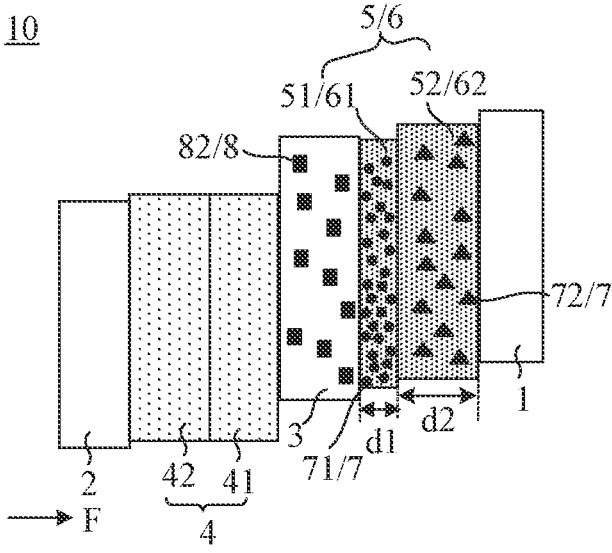
FIG. 8 is a structural diagram of yet another light-emitting device, in accordance with some embodiments of the present disclosure.

In some examples, as shown in FIG. 8, the first carrier functional layer 61 is the first hole transporting layer 51, and the second carrier functional layer 62 is the second hole transporting layer 52; the ligand material 7 of the first hole transporting layer 51 is the first ligand 71, and the first ligand 71 may be the hydrophilic ligand; the ligand material 7 of the second hole transporting layer 52 is the second ligand 72, and the second ligand 72 may be the hydrophobic ligand. In this case, the first hole transporting layer 51 is hydrophilic, the second hole transporting layer 52 is hydrophobic, and the light-emitting layer 3 may be the hydrophobic light-emitting layer. The polarities of the first hole transporting layer 51 and the light-emitting layer 3 are opposite.

The polarity of the light-emitting layer 3 is set to be opposite to the polarity of the first carrier functional layer 61, which may ensure that interfaces will not be destroyed due to mutual dissolution between the light-emitting layer 3 and the first carrier functional layer 61 during a deposition process, thereby preventing the performance of the light-emitting device 10 from being affected.

Figure 9A:
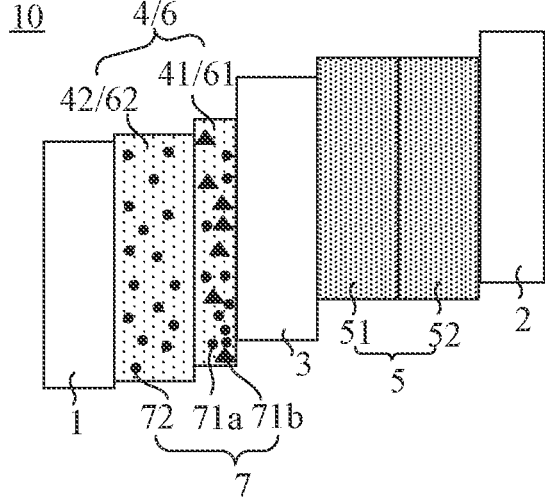
FIG. 9*a* is a structural diagram of yet another light-emitting device, in accordance with some embodiments of the present disclosure.
Figure 9B:
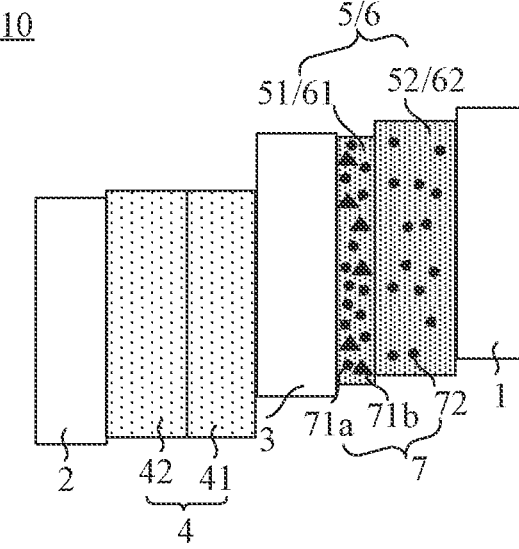
FIG. 9*b* is a structural diagram of yet another light-emitting device, in accordance with some embodiments of the present disclosure.
Figure 10:
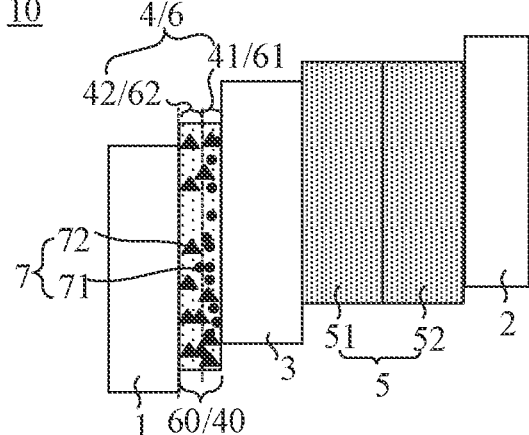
FIG. 10 is a structural diagram of yet another light-emitting device, in accordance with some embodiments of the present disclosure.

In some embodiments, as shown in FIGS. 9a, 9b and 10, the ligand material 7 of the first carrier functional layer 61 is a first ligand 71, the first ligand 71 includes a first sub-ligand 71a and a second sub-ligand 71b, and a material of the first sub-ligand 71a and a material of the second sub-ligand 71b are different. That is, the first carrier functional layer 61 includes two types of ligand materials.

A polarity of the first sub-ligand 71a and a polarity of the second sub-ligand 71b are opposite.

For example, the first sub-ligand 71a may be a hydrophilic ligand, and thus the second sub-ligand 71b may be a hydrophobic ligand. The first sub-ligand 71a may be a hydrophobic ligand, and thus the second sub-ligand 71b may be a hydrophilic ligand. The materials of the hydrophilic ligand and the hydrophobic ligand are as described above, which will not be repeated here.

As shown in FIG. 9a, of the first carrier functional layer 61, a concentration of the ligand material 7 contained in a side proximate to the light-emitting layer 3 is greater than a concentration of the ligand material 7 contained in a side away from the light-emitting layer 3. The ligand material 7 of the second carrier functional layer 62 is a second ligand 72, the material of the first sub-ligand 71a and a material of the second ligand 72 are the same, and the host material of the second carrier functional layer 62 and the host material of the first carrier functional layer 61 are the same. A mass fraction of the second sub-ligand 71b of the first carrier functional layer 61 and the mass fraction of the second ligand 72 of the second carrier functional layer 62 are equal.

In some examples, as shown in FIG. 9a, the first carrier functional layer 61 is the first electron transporting layer 41, the second carrier functional layer 62 is the second electron transporting layer 42, the ligand material 7 of the first electron transporting layer 41 includes a hydrophilic first sub-ligand 71a and a hydrophobic second sub-ligand 71b, and the second electron transporting layer 42 includes a hydrophilic second ligand 72. In this case, the mass fraction of the second sub-ligand 71b of the first electron transporting layer 41 may be equal to the mass fraction of the second ligand 72 of the second electron transporting layer 42, and the first sub-ligand 71a enters the first electron transporting layer 41 by immersing, so as to achieve a purpose that the mass fraction of the ligand material 7 of the first electron transporting layer 41 is greater than that of the second ligand 72 of the second electron transporting layer 42. As for a manufacturing method, reference may be made to the following description, which will not be described in detail here.

Figure 26:
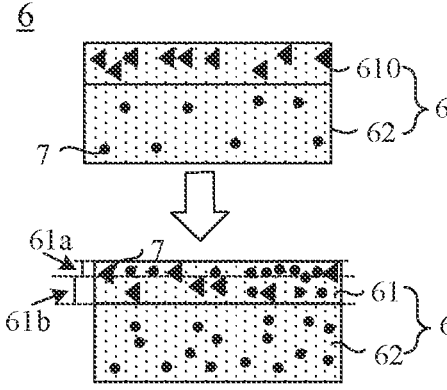
FIG. 26 is a diagram showing steps of manufacturing a carrier functional layer, in accordance with some embodiments of the present disclosure.

As shown in FIG. 26, it will be understood that the first carrier functional layer 61 may be regarded as including two layers that are a first first carrier functional layer 61a and a second first carrier functional layer 61b, and the first first carrier functional layer 61a is farther away from the second carrier functional layer 62 than the second first carrier functional layer 61b. That is, the first first carrier functional layer 61a is closer to the light-emitting layer 3 (not shown in the figure, and a specific structure may be referred to FIGS. 9a and 9b). A mass fraction of a ligand material 7 of the first first carrier functional layer 61a is greater than a mass fraction of a ligand material 7 of the second first carrier functional layer 61b.

In a case where the first carrier functional layer 61 includes the hydrophobic second sub-ligand 71b, the hydrophilic first sub-ligand 71a enters the first electron transporting layer 41 by immersing. The first sub-ligand 71*a* and the second sub-ligand 71*b* that have the opposite polarities are adopted, which is conducive to ensuring a film layer stability of the first carrier functional layer 61 during immersing, so that a dissolution of the first carrier functional layer 61 is avoided being destroyed.

It will be noted that, the first sub-ligand 71*a* enters the first carrier functional layer 61 by immersion of an immersion solution, and thus the first sub-ligand 71*a* in the immersion solution enters the first carrier functional layer 61 by a manner of diffusion; alternatively, the first sub-ligand 71*a* enters the first carrier functional layer 61 by a manner of exchange of the ligand material 7. In the first carrier functional layer 61, the closer to the immersion solution, the more of the first sub-ligand 71*a* enters the first carrier functional layer 61.

The number of carbon atoms of the first sub-ligand 71*a* of the first carrier functional layer 61 is in a range from 2 to 6, inclusive.

In the ligand material 7, a ligand material of which the number of carbon atoms is in a range from 2 to 6 is a short chain ligand, which has a relatively poor solubility, and is prone to be separated from the immersion solution and bonded to a film layer immersed into the immersion solution. For example, the short chain ligand is bonded to the first electron transporting layer 41 by means of coordination or adsorption.

In some examples, as shown in FIG. 9*b*, the first carrier functional layer 61 is the first hole transporting layer 51, the second carrier functional layer 62 is the second hole transporting layer 52, the ligand material 7 of the first hole transporting layer 51 includes a hydrophilic first sub-ligand 71*a* and a hydrophobic second sub-ligand 71*b*, and the second hole transporting layer 52 includes a hydrophilic second ligand 72. In this case, the mass fraction of the second sub-ligand 71*b* of the first hole transporting layer 51 may be equal to the mass fraction of the second ligand 72 of the second hole transporting layer 52, and the first sub-ligand 71*a* enters the first hole transporting layer 51 by immersing, so as to achieve a purpose that the mass fraction of the ligand material 7 of the first hole transporting layer 51 is greater than the mass fraction of the second ligand 72 of the second hole transporting layer 52. As for a manufacturing method, reference may be made to the following description, which will not be described in detail here.

It will be understood that it may be that the mass fraction of the first sub-ligand 71*a* of the first carrier functional layer 61 is equal to the mass fraction of the second ligand 72 of the second carrier functional layer 62, the polarity of the first sub-ligand 71*a* is opposite to the polarity of the second ligand 72; and the second sub-ligand 71*b* enters the first carrier functional layer 61 by immersing, so as to achieve a purpose that the mass fraction of the ligand material 7 of the first carrier functional layer 61 is greater than the mass fraction of the ligand material 7 of the second carrier functional layer 62. Details will not be repeated here.

By means of the solution immersion, the ligand material 7 contained in the immersion solution enters the first carrier functional layer 61 by a manner of diffusion or exchange, so that the ligand material 7 is bonded to the atoms of the host material of the first carrier functional layer 61 by coordination bonding, an adsorption force, a capillary force or a van der waals force, so as to be remained in the first carrier functional layer 61.

It will be understood that the light-emitting device 10 as shown in FIGS. 9*a* and 9*b* is described by taking an example where the second ligand 72 of the second carrier functional layer 62 is the hydrophilic ligand. The second ligand 72 of the second carrier functional layer 62 may be the hydrophobic ligand, which will not be repeated here.

It will be noted that the second ligand 72 is any one of the hydrophilic ligand and the hydrophobic ligand, the first sub-ligand 71*a* is any one of the hydrophilic ligand and the hydrophobic ligand, and the second sub-ligand 71*b* is any one of the hydrophilic ligand and the hydrophobic ligand.

In some embodiments, as shown in FIG. 10, of an initial carrier functional layer 60, a concentration of the ligand material 7 contained on a side proximate to the light-emitting layer 3 is greater than a concentration of the ligand material 7 contained on a side away from the light-emitting layer 3; of the initial carrier functional layer 60, a portion on the side proximate to the light-emitting layer 3 forms the first carrier functional layer 61, and another portion forms the second carrier functional layer 62.

For example, the initial carrier functional layer 60 includes two portions, i.e., a portion proximate to the light-emitting layer 3 and a portion away from the light-emitting layer 3. For example, before the light-emitting layer 3 is formed, the initial carrier functional layer 60 is subjected to an immersion treatment by immersing, and the ligand material 7 contained in an immersion solution enters the initial carrier functional layer 60 by a manner of diffusion or exchange, so that a concentration of the ligand material 7 of a respective portion is improved, which may be understood that the initial carrier functional layer 60 is divided into two layers, a portion of which a concentration of the ligand material 7 is relatively high is referred to as the first carrier functional layer 61, and the remaining portion is referred to as the second carrier functional layer 62. In this case, the mass fraction of the ligand material 7 of the first carrier functional layer 61 is greater than the mass fraction of the ligand material 7 of the second carrier functional layer 62.

For example, a polarity of the ligand material 7 of the immersion solution may be opposite to a polarity of the ligand material 7 of the initial carrier functional layer 60.

It will be noted that, in a case where the first ligand 71 of the first carrier functional layer 61 includes two types of ligand materials 7 having opposite polarities, the polarity of the light-emitting layer 3 may be opposite to the polarity of the ligand material 7 that later enters the first carrier functional layer 61. For example, if the hydrophobic second sub-ligand 71*b* enters the first carrier functional layer 61 by immersing, the light-emitting layer 3 may contain the hydrophilic ligand 81, this is because a surface of the first carrier functional layer 61 after being immersed by the hydrophobic second sub-ligand 71*b* contains more of the second sub-ligand 71*b* due to diffusion or exchange of the second sub-ligand 71*b*. Therefore, the polarity of the light-emitting layer 3 is opposite to the polarity of the ligand material 7 that later enters the first carrier functional layer 61, which may avoid a damage to an interface of the film layers.

Figure 12:
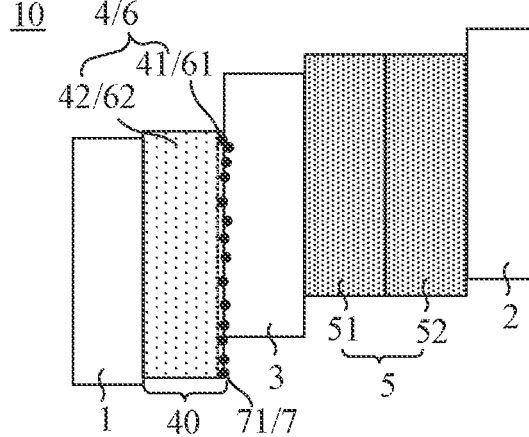
FIG. 12 is a structural diagram of yet another light-emitting device, in accordance with some embodiments of the present disclosure.

In some examples, as shown in FIG. 12, the first carrier functional layer 61 includes a first ligand 71, and the mass fraction of the ligand material 7 of the second carrier functional layer 62 is 0. The second carrier functional layer 62 contains no ligand material 7.

For example, the carrier functional layer 6 is the electron transporting layer 4, an initial electron transporting layer 40 is formed by magnetron sputtering, and the initial electron transporting layer 40 is immersed in an immersion solution containing the ligand material 7, so that the ligand material 7 is attached to a surface of the initial electron transporting layer 40. The surface, to which the ligand material 7 is attached, of the initial electron transporting layer 40 is the first electron transporting layer 41, the remaining portion of the initial electron transporting layer 40 is the second electron transporting layer 42, and the mass fraction of the ligand material 7 of the second electron transporting layer 42 is 0.

In some examples, as shown in FIGS. 1a, 3, 5, 7, 9a and 10, the host material of the first carrier functional layer 61 is nanoparticles, and a grain size of the nanoparticles is in a range from 3 nm to 5 nm. For example, the grain size of the nanoparticles is 3 nm, 4 nm or 5 nm.

In some examples, as shown in FIG. 1a, a surface roughness (RMS, i.e., root mean square of roughness) of the second carrier functional layer 62 is in a range from 0.2 nm to 1.5 nm. For example, the second carrier functional layer 62 is the second electron transporting layer 42, the second electron transporting layer 42 is formed by magnetron sputtering, the surface roughness of the second electron transporting layer 42 is 0.2 nm, 0.7 nm or 1.5 nm, and the surface flatness thereof is relatively good. A surface roughness (RMS, i.e., root mean square of roughness) of the first carrier functional layer 61 is in a range from 0.5 nm to 5 nm, inclusive, which satisfies a requirement for the flatness of the surface of the film layer.

In some embodiments, as shown in FIG. 12, the carrier functional layer 6 is the electron transporting layer 4, the first carrier functional layer 61 is the first electron transporting layer 41, and the second carrier functional layer 62 is the second electron transporting layer 42. The second electron transporting layer 42 contains no ligand material 7. The initial electron transporting layer 40 is formed by magnetron sputtering, a surface roughness (RMS, i.e., root mean square of roughness) of the initial electron transporting layer 40 is in a range from 0.5 nm to 2 nm, inclusive, and the surface flatness thereof is relatively good. The initial electron transporting layer 40 is immersed in the solution containing the ligand material 7, and the ligand material 7 forms, by chemical adsorption, a chemical bond with a zinc atom or a group, such as —O or —OH, in the initial electron transporting layer 40, and is adsorbed to the surface of the initial electron transporting layer 40. The portion, to which the ligand material 7 is adsorbed, of the initial electron transporting layer 40 may be regarded as a monomolecular layer and forms the first electron transporting layer 41. A surface roughness (RMS, i.e., root mean square of roughness) of the first electron transporting layer 41 is in a range from 0.5 nm to 2 nm, inclusive.

That is, after the initial electron transporting layer 40 formed by magnetron sputtering is immersed in the solution containing the ligand material 7, the surface roughness of the initial electron transporting layer 40 does not change much, and the surface flatness is relatively good.

It will be noted that the ligand material 7 contained in the first electron transporting layer 41 may be the hydrophilic ligand or the hydrophobic ligand, which is not specifically limited here.

In some embodiments, with continued reference to FIGS. 7 and 8, a ratio of a thickness d1 of the first carrier functional layer 61 to a thickness d2 of the second carrier functional layer 62 is in a range from 1:20 to 20:1.

It will be noted that the thickness d1 of the first carrier functional layer 61 refers to a dimension of the first carrier functional layer 61 in a direction F in which all functional film layers of the light-emitting device 10 are arranged, and all the functional film layers of the light-emitting device 10 include the electron transporting layer 4, the light-emitting layer 3 and the hole transporting layer 5. The same is true for the thickness d2 of the second carrier functional layer 62, which will not be repeated here.

For example, the ratio of the thickness d1 of the first carrier functional layer 61 to the thickness d2 of the second carrier functional layer 62 is 1:20, 1:10, 1:5, 1:1, 10:1 or 20:1, which is not limited here.

In some embodiments, with continued reference to FIGS. 7 and 8, the thickness d1 of the first carrier functional layer 61 is less than the thickness d2 of the second carrier functional layer 62.

In some examples, as shown in FIG. 7, the first carrier functional layer 61 is the first electron transporting layer 41, the second carrier functional layer 62 is the second electron transporting layer 42, and the thickness d1 of the first electron transporting layer 41 is less than the thickness d2 of the second electron transporting layer 42. For example, the thickness d1 of the first electron transporting layer 41 is 10 nm, and the thickness d2 of the second electron transporting layer 42 is 50 nm. In a case where the content of the ligand material 7 of the first electron transporting layer 41 is improved, the electron mobility of the first electron transporting layer 41 is reduced; in this case, if the thickness d1 of the first electron transporting layer is too large, the electron transportation will be further affected, so that the electron transportation will be hindered. As a result, it is not conducive to the balance of the electron transportation of the light-emitting device 10.

In some examples, as shown in FIG. 8, the first carrier functional layer 61 is the first hole transporting layer 51, the second carrier functional layer 62 is the second hole transporting layer 52, and the thickness d1 of the first hole transporting layer 51 is less than the thickness d2 of the second hole transporting layer 52.

Increasing the content of the ligand material 7 of the carrier functional layer 6 and increasing the thickness of the carrier functional layer 6 will both hinder the carrier transportation. Therefore, in a case where the mass fraction of the ligand of the first carrier functional layer 61 is greater than the mass fraction of the ligand of the second carrier functional layer 62, in order to prevent the carrier transportation from being hindered, the thickness of the first carrier functional layer 61 may be reduced, so that it is conducive to maintaining the balance of the carrier transportation.

In some embodiments, with continued reference to FIGS. 7 and 8, a sum of the thicknesses of the first carrier functional layer 61 and the second carrier functional layer 62 is in a range from 20 nm to 60 nm.

For example, the sum, i.e., (d1+d2), of the thickness d1 of the first carrier functional layer 61 and the thickness d2 of the second carrier functional layer 62 is 20 nm, 25 nm, 30 nm, 35 nm, 40 nm, 45 nm, 50 nm, 55 nm or 60 nm, which is not limited here.

In some embodiments, with continued reference to FIGS. 7 and 8, the thickness d1 of the first carrier functional layer 61 is in a range from 5 nm to 55 nm, and the thickness d2 of the second carrier functional layer 62 is in a range from 5 nm to 55 nm.

In some examples, as shown in FIG. 7, the first carrier functional layer 61 is the first electron transporting layer 41, and the second carrier functional layer 62 is the second electron transporting layer 42. The thickness d1 of the first electron transporting layer 41 is 5 nm, 15 nm, 20 nm, 30 nm, 40 nm, 45 nm or 55 nm, which is not limited here. The thickness d2 of the second electron transporting layer 42 is 5 nm, 10 nm, 15 nm, 20 nm, 25 nm, 50 nm or 55 nm, which is not limited here.

In some examples, as shown in FIG. 8, the first carrier functional layer 61 is the first hole transporting layer 51, and the second carrier functional layer 62 is the second hole transporting layer 52. The thickness d1 of the first hole transporting layer 51 is 5 nm, 10 nm, 20 nm, 25 nm, 40 nm, 25 nm or 55 nm, which is not limited here. The thickness d2 of the second hole transporting layer 52 is 5 nm, 10 nm, 20 nm, 25 nm, 35 nm, 45 nm or 55 nm, which is not limited here.

It will be noted that, a thickness of a particle layer is generally 5 nm, and the particle layer is a basic unit for forming the carrier functional layer 6. Therefore, the thickness d1 of the first carrier functional layer 61, the thickness d2 of the second carrier functional layer 62 and the sum of the thickness d1 of the first carrier functional layer 61 and the thickness d2 of the second carrier functional layer 62 are each generally a multiple of 5 nm.

In some embodiments, the ligand material 7 includes any one of an organic ligand and an inorganic ligand.

For example, the organic ligand mainly includes organic amines such as alkylamine having terminals of which the number of carbon atoms is in a range from 1 to 10 (e.g., ethanolamine), aromatic amine having terminals of which the number of carbon atoms is in a range from 6 to 20 (e.g., aniline), trimethylamine, triethylamine, tripropylamine, tributylamine or triphenylamine. In addition to the organic amines, the organic ligand may be thiols such as alkyl thioalcohol having terminals of which the number of carbon atoms is in a range from 1 to 10 (e.g., 1-octanethiol or 2-ethyl-1-hexanethiol), aromatic mercaptan having terminals of which the number of carbon atoms is in a range from 6 to 20 (e.g., aniline), or mercaptoalcohol (mercaptoethanol or 1-mercapto-3-propanol). Alternatively, the organic ligand may be mercapto carboxylic acids or amino carboxylic acids, and two terminals of a chain of the organic ligand are provided with two types of functional groups thereon.

For example, the inorganic ligand is a halogen-based ligand or an ammonium-based ligand. It is possible to improve the conductivity of the carrier functional layer 6 by using the inorganic ligand material 7.

In some embodiments, a material of the light-emitting layer 3 is quantum dots.

For example, the quantum dots are red cadmium selenide (CdSe) materials.

Figure 11:
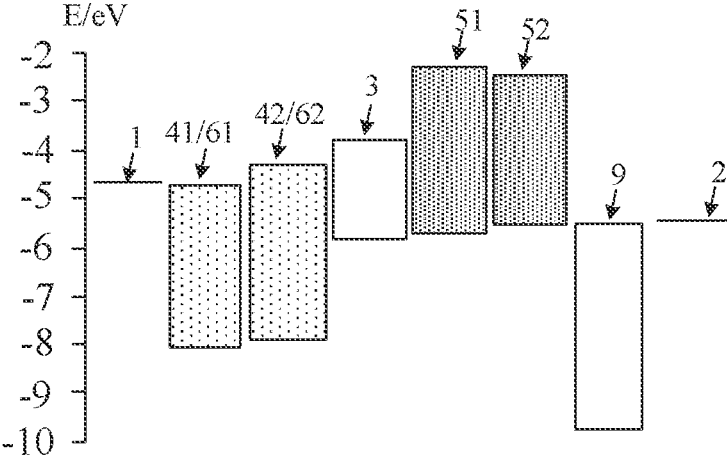
FIG. 11 is a schematic diagram showing an energy level difference among film layers in a light-emitting device, in accordance with some embodiments of the present disclosure.

In some embodiments, as shown in FIG. 11, an energy level difference $\Delta E2$ between the first carrier functional layer 61 and the second carrier functional layer 62 is in a range from 0.1 eV to 0.3 eV, an energy level difference $\Delta E1$ between the second carrier functional layer 62 and the first electrode 1 is in a range from 0.1 eV to 0.3 eV, and an energy level difference $\Delta E3$ between the first carrier functional layer 61 and the light-emitting layer 3 is in a range from 0.1 eV to 0.3 eV.

It will be noted that the hole transporting layer 5 and the second electrode 2 are provided with a hole injection layer 9 therebetween.

For example, with continued reference to FIG. 11, the first electrode 1 is the cathode, the second electrode 2 is the anode, the first carrier functional layer 61 is the first electron transporting layer 41, and the second carrier functional layer 62 is the second electron transporting layer 42. The energy level difference $\Delta E2$ between the first electron transporting layer 41 and the second electron transporting layer 42 is a lowest unoccupied molecular orbital (LUMO) energy level difference. That is, a LUMO energy level of the first electron transporting layer 41 is greater than a LUMO energy level of the second electron transporting layer 42. For example, the LUMO energy level difference $\Delta E2$ between the first electron transporting layer 41 and the second electron transporting layer 42 may be 0.1 eV, 0.15 eV, 0.2 eV or 0.3 eV, which is not limited here.

The energy level difference $\Delta E1$ between the second electron transporting layer 42 and the first electrode 1 is a difference between a LUMO energy level of the second electron transporting layer 42 and a work function of the first electrode 1. For example, the energy level difference $\Delta E1$ between the LUMO energy level of the second electron transporting layer 42 and the work function of the first electrode 1 is 0.1 eV, 0.2 eV, 0.25 eV or 0.3 eV, which is not limited here.

The energy level difference $\Delta E3$ between the first electron transporting layer 41 and the light-emitting layer 3 is a LUMO energy level difference. That is, a LUMO energy level of the light-emitting layer 3 is greater than the LUMO energy level of the first electron transporting layer 41. For example, the LUMO energy level difference $\Delta E3$ between the light-emitting layer 3 and the first electron transporting layer 41 may be 0.1 eV, 0.15 eV, 0.25 eV or 0.3 eV, which is not limited here.

It will be noted that a LUMO energy level refers to an orbital energy level that is not occupied by electrons and has a lowest energy level.

The first carrier functional layer 61 and the second carrier functional layer 62 having the different contents of the ligand materials 7 are provided, so that the energy level difference between the first carrier functional layer 61 and the second carrier functional layer 62 is adjusted, and the energy levels of the film layers that are from the first electrode 1 to the light-emitting layer 3 changes in a step-wise manner and the magnitudes of the energy level differences are effectively controlled. As a result, the carrier mobility is improved, so that the working voltage of the light-emitting device 10 is reduced, and the service life of the light-emitting device 10 is prolonged.

In some embodiments, the energy level difference $\Delta E2$ between the first carrier functional layer 61 and the second carrier functional layer 62 is greater than the energy level difference $\Delta E1$ between the second carrier functional layer 62 and the first electrode 1, and greater than the energy level difference $\Delta E3$ between the first carrier functional layer 61 and the light-emitting layer 3. That is, $\Delta E2 > \Delta E1$, and $\Delta E2 > \Delta E3$.

The carriers need to be injected into the second carrier functional layer 62 from the first electrode 1, and the carriers need to be injected into the light-emitting layer 3 from the first carrier functional layer 61. Thus, the energy level difference $\Delta E1$ between the second carrier functional layer 62 and the first electrode 1 and the energy level difference $\Delta E3$ between the first carrier functional layer 63 and the light-emitting layer 3 are both relatively small (that is, the barriers are relatively small), which may reduce the working voltage.

The energy level difference $\Delta E2$ between the first carrier functional layer 61 and the second carrier functional layer 62 has a relatively small influence on the working voltage. Furthermore, a relatively large energy level difference $\Delta E2$ between the first carrier functional layer 61 and the second carrier functional layer 62 may properly reduce the transportation efficiency of the carriers such as the transportation efficiency of the electrons, which adjusts the balance of the carrier injection of the light-emitting device 10, so that it is conducive to improving the efficiency of the light-emitting device 10.

In some embodiments, as shown in FIGS. 1a, 3, 5, 7, 9a, 11 and 12, the carrier functional layer 6 is the electron transporting layer 4, the first carrier functional layer 61 is the first electron transporting layer 41, and the second carrier functional layer 62 is the second electron transporting layer 42. A LUMO energy level of the ligand material 7 is greater than a LUMO energy level of a layer for forming the electron transporting layer 4.

It will be noted that the electron transporting layer 4 in the description "the LUMO energy level of the ligand material 7 is greater than the LUMO energy level of the layer for forming the electron transporting layer 4" here is the layer for forming the electron transporting layer 4 containing no ligand material 7. The electron transporting layer 4 in the embodiments of the present disclosure may be the electron transporting layer 4 containing the ligand material 7 or the electron transporting layer 4 containing no ligand material 7, which may be specifically understood according to the description and will not be repeated here.

The ligand material 7 of which the LUMO energy level is greater than the LUMO energy level of the layer for forming the electron transporting layer 4 is introduced into the layer for forming the electron transporting layer 4, so as to form the electron transporting layer 4 containing the ligand material 7 such as the first electron transporting layer 41 and the second electron transporting layer 42, thereby adjusting the LUMO energy levels of the first electron transporting layer 41 and the second electron transporting layer 42. Moreover, the mass fraction of the ligand material 7 of the first electron transporting layer 41 is greater than the mass fraction of the ligand material 7 of the second electron transporting layer 42, which enables the LUMO energy level of the first electron transporting layer 41 to be greater than the LUMO energy level of the second electron transporting layer 42 and closer to the LUMO energy level of the light-emitting layer 3, so that the electron injection barrier is reduced. As a result, the purpose of reducing the working voltage of the light-emitting device 10 is achieved, and the service life of the light-emitting device 10 is prolonged.

In some embodiments, the LUMO energy level of the ligand material 7 is greater than the LUMO energy level of the layer for forming the electron transporting layer 4 by 1 eV or more.

For example, the LUMO energy level of the ligand material 7 is greater than the LUMO energy level of the layer for forming the electron transporting layer 4 by 1.1 eV, 1.2 eV, 1.3 eV or the like, which is not limited here.

In some embodiments, as shown in FIGS. 1a, 3, 5, 7, 9a, 11 and 12, the same atoms included in the host material of the first carrier functional layer 61 and the host material of the second carrier functional layer 62 include an oxygen atom and a zinc atom.

For example, the first carrier functional layer 61 is a first electron transporting layer 41 formed of ZnO nanoparticles, and the second carrier functional layer 62 is a second electron transporting layer 42 formed of a ZnO n-type semiconductor film or ZnO nanoparticles.

It will be noted that an n-type semiconductor is also referred to as an electronic type semiconductor. The n-type semiconductor is an impurity semiconductor of which a concentration of free electrons is much greater than a concentration of holes, and is a semiconductor material of which electrons are the majority of the carriers, n means negative.

The first electron transporting layer 41 and the second electron transporting layer 42 each include the same atoms such as the oxygen atom and the zinc atom, and the energy level and the carrier mobility of the electron transporting layer 4 where the ligand material 7 is located are adjusted only by the content of the ligand material 7. Thus, the material preparation cost is relatively low, the material compatibility of the two layers is good, and the interface defects are relatively few.

In some embodiments, as shown in FIGS. 1a, 3, 5, 7, 9a, 11 and 12, at least one of the first carrier functional layer 61 and the second carrier functional layer 62 further includes a dopant atom, and the dopant atom includes at least one of magnesium, aluminum, zirconium, hafnium and yttrium.

For example, as shown in FIG. 1a, the first carrier functional layer 61 is a first electron transporting layer 41 formed of a ZnO n-type semiconductor film, and the second carrier functional layer 62 is a second electron transporting layer 42 formed of ZnO nanoparticles; the first electron transporting layer 41 may be doped with at least one of magnesium (Mg), aluminum (Al), zirconium (Zr), hafnium (Hf) and yttrium (Y), and the second electron transporting layer 42 may be doped with at least one of Mg, Al, Zr, Hf and Y.

For example, a doping content of the dopant atom, i.e., at least one of Mg, Al, Zr, Hf and Y, in the electron transporting layer 4 is generally in a range from 0% to 30%. For example, the doping content is 5%, 10%, 20%, 30% or the like.

The dopant atom included in the electron transporting layer 4 may generally have a function of reducing the electron mobility. For example, doping of the atoms Mg, Zr, gallium (Ga), Hf, Y, cuprum (Cu) and lithium (Li) may reduce the electron mobility of the electron transporting layer 4, and doping of indium (In) and Al may improve the electron mobility. Therefore, it is possible to assist in adjusting the electron mobility of the electron transporting layer 4 by adjusting the type and the content of the dopant atom in the electron transporting layer 4.

In some embodiments, as shown in FIGS. 2, 4, 6, 8 and 9b, the carrier functional layer 6 is the hole transporting layer 5, the first carrier functional layer 61 is the first hole transporting layer 51, and the second carrier functional layer 62 is the second hole transporting layer 52. A HOMO energy level of the ligand material 7 is less than a HOMO energy level of a layer for forming the hole transporting layer 5.

It will be noted that the hole transporting layer 5 in the description "the HOMO energy level of the ligand material 7 is less than the HOMO energy level of the layer for forming the hole transporting layer 5" here is the layer for forming the hole transporting layer 5 containing no ligand material 7. The hole transporting layer 5 in the embodiments of the present disclosure may be the hole transporting layer 5 containing the ligand material 7 or the hole transporting layer 5 containing no ligand material 7, which may be specifically understood according to the description and will not be repeated here.

The ligand material 7 of which the HOMO energy level is lower than the HOMO energy level of the hole transporting layer 5 is introduced into the hole transporting layer 5, so as to form the hole transporting layer 5 containing the ligand material 7 such as the first hole transporting layer 51 and the second hole transporting layer 52, thereby adjusting the HOMO energy levels of the first hole transporting layer 51 and the second hole transporting layer 52. Moreover, the mass fraction of the ligand material 7 of the first hole transporting layer 51 is greater than the mass fraction of the ligand material 7 of the second hole transporting layer 52, which enables the HOMO energy level of the first hole transporting layer 51 to be less than the HOMO energy level of the second hole transporting layer 52, so that the energy level difference between the light-emitting layer 3 and the HOMO of the first hole transporting layer 51 is reduced. As a result, it is conducive to the hole injection into the light-emitting layer 3.

In some embodiments, the HOMO energy level of the ligand material 7 is less than the HOMO energy level of the layer for forming the hole transporting layer 5 by 1 eV or more.

For example, the HOMO energy level of the ligand material 7 is less than the HOMO energy level of the layer for forming the hole transporting layer 5 by 1.1 eV, 1.2 eV, 1.3 eV or the like, which is not limited here.

In some embodiments, as shown in FIGS. 2, 4, 6, 8 and 9*b*, the same atoms included in the host material of the first carrier functional layer 61 and the host material of the second carrier functional layer 62 are an oxygen atom and any one of a nickel atom, a molybdenum atom, a tungsten atom, a vanadium atom and a zirconium atom.

In some examples, as shown in FIG. 2, the first carrier functional layer 61 is a first hole transporting layer 51 formed of any one of nickel oxide, molybdenum oxide, tungsten oxide, vanadium oxide and zirconium oxide, and the second carrier functional layer 62 is a second hole transporting layer 52 formed of any one of nickel oxide, molybdenum oxide, tungsten oxide, vanadium oxide and zirconium oxide.

The host material of the first hole transporting layer 51 and the host material of the second hole transporting layer 52 include the same atoms, and the energy level and the carrier mobility of the hole transporting layer 5 where the ligand material 7 is located are adjusted only by the content of the ligand material 7. Thus, the material preparation cost is relatively low, the material compatibility of the two layers is good, and the interface defects are relatively few.

Some embodiments of the present disclosure provide a method of manufacturing a light-emitting device, and the method of manufacturing the light-emitting device includes steps S1 to S3.

In the step S1, a first electrode 1 and a second electrode 2 are formed.

For example, the first electrode 1 is one of an anode and a cathode, and the second electrode 2 is the other of the anode and the cathode.

For example, the first electrode 1 may be indium tin oxide (ITO), a semiconductor electrode (an fluorine-doped tin oxide (FTO) glass electrode) or a conductive polymer that is transparent, or may be an opaque metal electrode (e.g., aluminum or argentum); a thickness of the first electrode 1 may be in a range from 10 nm to 100 nm, inclusive.

For example, the second electrode 2 may be ITO, a semiconductor electrode (an FTO glass electrode) or a conductive polymer that is transparent, or may be an opaque metal electrode (e.g., aluminum or argentum); a thickness of the second electrode 2 may be in a range from 10 nm to 100 nm, inclusive.

It will be noted that the order of the formation of the first electrode 1 and the second electrode 2 is not limited in the step S1.

In the step S2, a light-emitting layer 3 between the first electrode 1 and the second electrode 2 is formed.

For example, the light-emitting layer 3 is a quantum dot light-emitting layer deposited by ink jet printing or photo-etching, and the quantum dot light-emitting layer may emit light of one of a red color, a green color and a blue color.

For example, a thickness of the light-emitting layer 3 is in a range from 20 nm to 50 nm, inclusive.

It will be noted that the order of the formation of the first electrode 1, the second electrode 2 and the light-emitting layer 3 is not limited in the step S2.

In the step S3, a carrier functional layer 6 located on a side of the first electrode 1 is formed.

For example, the carrier functional layer 6 may be an electron transporting layer 4 or a hole transporting layer 5.

It will be noted that the order of the steps S1, S2 and S3 is not specifically limited in the above description.

The step S3 of forming the carrier functional layer 6 located on the side of the first electrode 1 includes steps S31 to S32.

In the step S31, a first carrier functional layer 61 is formed.

For example, the first carrier functional layer 61 may be a first electron transporting layer 41 or a first hole transporting layer 51.

In the step S32, a second carrier functional layer 62 is formed.

For example, in a case where the first carrier functional layer 61 is the first electron transporting layer 41, the second carrier functional layer 62 is a second electron transporting layer 42. In a case where the first carrier functional layer 61 is the first hole transporting layer 51, the second carrier functional layer 62 is a second hole transporting layer 52.

For example, the second electron transporting layer 42 is formed by any one of magnetron sputtering, spin coating, ink jet printing and a sol-gel method, and the first electron transporting layer 41 is formed by any one of spin coating, ink jet printing, a sol-gel method and a solution immersion method.

For example, the hole transporting layer 5 is formed by any one of spin coating, ink jet printing and a sol-gel method.

It will be noted that the order of the steps S31 and S32 is not specifically limited in the above description.

As shown in FIG. 1*a* and FIGS. 2 to 9*b*, the first carrier functional layer 61 is closer to the light-emitting layer 3 than the second carrier functional layer 62, the first carrier functional layer 61 contains a host material and a ligand material 7, the second carrier functional layer 62 contains a host material, and the host material of the first carrier functional layer 61 and the host material of the second carrier functional layer 62 include same atoms. A mass fraction of the ligand material 7 of the first carrier functional layer 61 is greater than a mass fraction of a ligand material 7 of the second carrier functional layer 62.

As for the description that the host material of the first carrier functional layer 61 and the host material of the second carrier functional layer 62 include the same atoms, and the mass fraction of the ligand material 7 of the first carrier functional layer 61 is greater than the mass fraction of the ligand material 7 of the second carrier functional layer 62, reference may be made to the above description, which will not be repeated here.

Steps that may be adopted for forming the second carrier functional layer 62 will be described below.

In some embodiments, the step S32 of forming the second carrier functional layer includes: forming the second carrier functional layer 62 by magnetron sputtering; or forming a second solution, and performing any one of spin coating, ink jet printing and a sol-gel method by using the second solution to form the second carrier functional layer 62. The second solution contains a host material for forming the second carrier functional layer 62, and a mass fraction of a ligand material 7 contained in the second solution is greater than or equal to 0. That is, it may be possible to form the second carrier functional layer 62 containing no ligand material 7.

In some examples, as shown in FIGS. 1*a* and 12, the second carrier functional layer 62 is the second electron transporting layer 42. The step S32 of forming the second electron transporting layer 42 includes: forming the second electron transporting layer 42 by magnetron sputtering, i.e., depositing, by physical bombing, a ZnO film on a surface of a substrate (not shown in the figure) by using a pure ZnO target; a grain size of ZnO is approximately in a range from 3 nm to 5 nm.

For example, the substrate may be a glass or flexible polyethylene terephthalate (PET) substrate.

The second carrier functional layer 62 may be any one of the second electron transporting layer 42 and the second hole transporting layer 52, and steps for forming the second carrier functional layer 62 containing the ligand material 7 will be described in the following examples.

In some examples, as shown in FIGS. 3, 5, 7 and 9*a*, the second carrier functional layer 62 is the second electron transporting layer 42. The step S32 of forming the second electron transporting layer 42 includes steps S32*a* to S32*b*.

In the step S32*a*, a second solution L21 is formed, the second solution L21 includes a host material (e.g., including an oxygen atom and a zinc atom), i.e., ZnO nanoparticles, for forming the electron transporting layer 4, and the second solution L21 further includes a ligand material 7 bonded to atoms of the host material included in the second solution L21.

In the step S32*b*, any one of spin coating, ink jet printing and a sol-gel method is performed by using the second solution L21 to form the second electron transporting layer 42.

It will be noted that the atoms for forming the host material of the second electron transporting layer 42 may further include a dopant atom, which is specifically as described above and will not be repeated here.

In some examples, as shown in FIGS. 4, 6, 8 and 9*b*, the second carrier functional layer 62 is the second hole transporting layer 52. The step S32 of forming the second hole transporting layer 52 includes steps S32A to S32B.

In the step S32A, a second solution L22 is formed, the second solution L22 includes a host material (e.g., an oxygen atom and a nickel atom), i.e., nickel oxide, for forming the hole transporting layer 5, and the second solution L22 further includes a ligand material 7 bonded to the host material included in the second solution L22.

In the step S32B, any one of spin coating, ink jet printing and a sol-gel method is performed by using the second solution L22 to form the second hole transporting layer 52.

It will be noted that, in addition to the oxygen atom, the host material for forming the hole transporting layer 5 may further include other metal atom, which is specifically as described above and will not be repeated here.

It will be noted that the ligand material 7 in the second solution may be a hydrophilic ligand or a hydrophobic ligand. The second solution is named according to the use of forming the second carrier functional layer 62, and in a case where a film layer represented by the second carrier functional layer 62 is different, a composition of the second solution may be different.

The above are described by taking an example where the formed second electron transporting layer 42 and the formed second hole transporting layer 52 each contain the ligand material 7, which are not limitations on the solutions for forming the second electron transporting layer 42 and forming the second hole transporting layer 52. It will be understood that the solutions (referred to as pre-film solutions below) for forming the second electron transporting layer 42 and forming the second hole transporting layer 52 may not both contain the ligand material 7.

The second carrier functional layer 62 may be any one of the second electron transporting layer 42 and the second hole transporting layer 52, and steps for forming the second carrier functional layer 62 containing no ligand material 7 will be described in the following examples.

For example, as shown in FIGS. 1*a*, 2, 4, 6, 8 and 9*b*, the second electron transporting layer 42 includes no ligand material 7. The step of forming the second electron transporting layer 42 includes steps S321 to S322.

In the step S321, a pre-film solution is formed, and the pre-film solution includes a host material for forming the electron transporting layer 4. For example, the host material includes an oxygen atom and a zinc atom. That is, the host material is ZnO nanoparticles.

In the step S322, any one of spin coating, ink jet printing and a sol-gel method is performed by using the pre-film solution to form the second electron transporting layer 42.

For example, as shown in FIGS. 1*a*, 3, 5, 7 and 9*a*, the second hole transporting layer 52 includes no ligand material 7. The step of forming the second hole transporting layer 52 includes steps S321' to S322'.

In the step S321', a pre-film solution is formed, and the pre-film solution includes atoms for forming the hole transporting layer 5. For example, the atoms are an oxygen atom and a nickel atom. That is, the material is nickel oxide.

In the step S322', any one of spin coating, ink jet printing and a sol-gel method is performed by using the pre-film solution to form the second hole transporting layer 52.

It will be noted that the pre-film solution for forming the hole transporting layer 5 may include any one of molybdenum oxide, tungsten oxide, vanadium oxide and zirconium oxide.

Steps that may be used for forming the first carrier functional layer 61 containing the ligand material 7 will be described below.

In some embodiments, the step S31 of forming the first carrier functional layer 61 includes:

forming a first solution; and performing any one of spin coating, ink jet printing and a sol-gel method by using the first solution to form the first carrier functional layer 61. The first solution contains a host material for forming the first carrier functional layer 61, and the first solution further contains a ligand material 7; the mass fraction of the ligand material 7 of the first carrier functional layer 61 is greater than the mass fraction of the ligand material 7 of the second carrier functional layer 62.

For example, the first carrier functional layer 61 is the first electron transporting layer 41. The step S31 of forming the first electron transporting layer 41 includes steps S31*a* to S31*b*.

In the step S31*a*, a first solution L11 is formed, the first solution L11 contains a host material for forming the electron transporting layer 4; for example, the host material includes an oxygen atom and a zinc atom, that is, the host material is ZnO nanoparticles; moreover, the first solution L11 further contains a ligand material 7.

In S31*b*, any one of spin coating, ink jet printing and a sol-gel method is performed by using the first solution L11 to form the first electron transporting layer 41.

For example, the first carrier functional layer 61 is the first hole transporting layer 51. The step S31 of forming the first hole transporting layer 51 includes steps S31A to S31B.

In the step S31A, a first solution L12 is formed, the first solution L21 includes a host material for forming the hole transporting layer 5; for example, the host material includes an oxygen atom and a nickel atom, that is, the host material is nickel oxide; moreover, the first solution L12 further includes a ligand material 7.

In the step S32B, any one of spin coating, ink jet printing and a sol-gel method is performed by using the first solution L12 to form the first hole transporting layer 51.

It will be noted that the ligand material 7 in the first solution may be a hydrophilic ligand or a hydrophobic ligand. The first solution is named according to the use of forming the first carrier functional layer 61, and in a case where a film layer represented by the first carrier functional layer 61 is different, a composition of the first solution may be different.

The carrier functional layer 6 may be any one of the electron transporting layer 4 and the hole transporting layer 5, and steps for forming the light-emitting device 10 including the carrier functional layer 6 will be described below.

Figure 13:
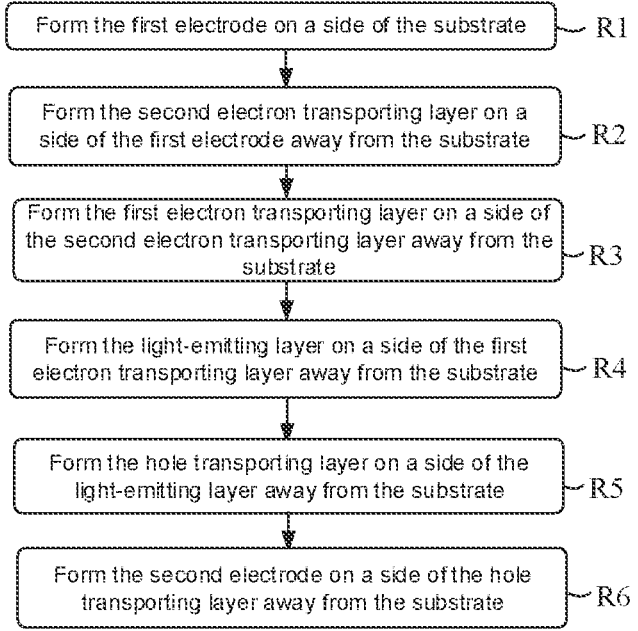
FIG. 13 is a flow diagram of a method of manufacturing a light-emitting device, in accordance with some embodiments of the present disclosure.

In an example where the carrier functional layer 6 of the light-emitting device 10 is the electron transporting layer 4, as shown in FIG. 13, the steps of forming the light-emitting device 10 includes steps R1 to R6.

Figure 14:
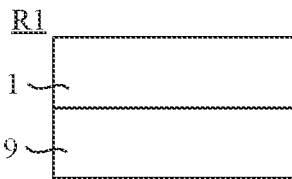
FIGS. 14 to 19 are diagrams each showing steps of a method of manufacturing a light-emitting device, in accordance with some embodiments of the present disclosure.

In the step R1, as shown in FIG. 14, the first electrode 1 is formed on a side of the substrate 9.

For example, the first electrode 1 is the cathode.

As for the description in which the first electrode 1 is the cathode, reference may be specifically made to the step S1, which will not be repeated here.

Figure 15:
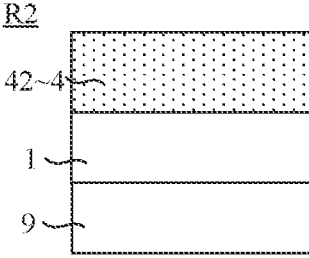

In the step R2, as shown in FIG. 15, the second electron transporting layer 42 is formed on a side of the first electrode 1 away from the substrate 9.

For example, in the step R2, the second electron transporting layer 42 containing the ligand material 7 (not shown in the figure, and a structure of which may be as shown in the second electron transporting layer 42 in FIG. 3) may be formed with reference to the steps S32a to S32b as described above, which will not be repeated here. The ligand material 7 of the second electron transporting layer 42 may be a hydrophilic ligand or a hydrophobic ligand, which will not be repeated here.

For example, in the step R2, the second electron transporting layer 42 may be formed with reference to the method of magnetron sputtering as described above, and the second electron transporting layer 42 manufactured by this method contains no ligand material 7, which will not be repeated here.

For example, as for the step R2, reference may be made to the steps S321 to S322 as described above, and the second electron transporting layer 42 may include no ligand material 7, which will not be repeated here.

Figure 16:
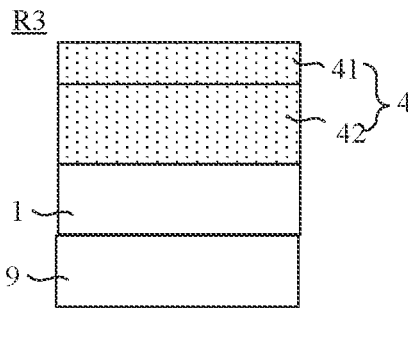

In the step R3, as shown in FIG. 16, the first electron transporting layer 41 is formed on a side of the second electron transporting layer 42 away from the substrate 9.

For example, in the step R3, the first electron transporting layer 41 containing the ligand material 7 (not shown in the figure, and a structure of which may be as shown in the first electron transporting layer 41 in FIG. 3) may be formed with reference to the steps S31a to S31b as described above; a content of the ligand material 7 in the first solution for forming the first electron transporting layer 41 is greater than a content of the ligand material 7 in the second solution for forming the second electron transporting layer 42, and the mass fraction of the ligand material 7 of the formed first electron transporting layer 41 is greater than the mass fraction of the ligand material 7 of the formed second electron transporting layer 42.

It will be noted that in a case where the second electron transporting layer 42 contains the ligand material 7, a polarity of the ligand material 7 of the first electron transporting layer 41 may be opposite to a polarity of the ligand material 7 of the second electron transporting layer 42. In a case where the second electron transporting layer 42 contains no ligand material 7, the ligand material 7 of the first electron transporting layer 41 may be a hydrophilic ligand or a hydrophobic ligand.

As for the hydrophilic ligand and the hydrophobic ligand, reference may be made to the above description, which will not be repeated here.

Figure 17:
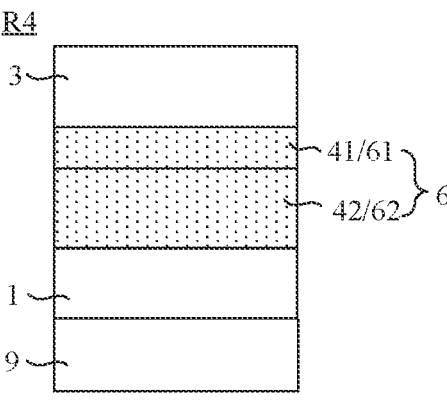

In the step R4, as shown in FIG. 17, the light-emitting layer 3 is formed on a side of the first electron transporting layer 41 away from the substrate 9.

For example, as for the step R4, reference may be made to the description of forming the light-emitting layer 3 in the step S2, which will not be repeated here.

Figure 18:
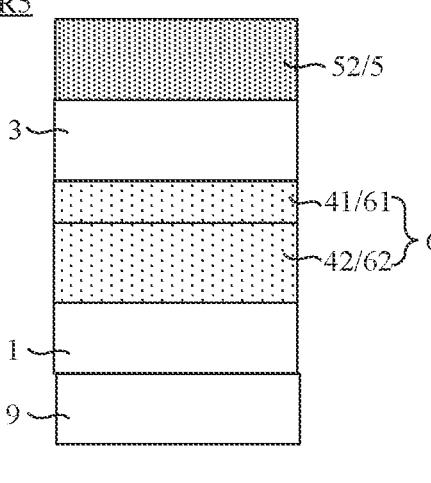

In the step R5, as shown in FIG. 18, the hole transporting layer 5 is formed on a side of the light-emitting layer 3 away from the substrate 9.

For example, in the step R5, the hole transporting layer 5 may be formed with reference to the steps S321' to S322' of forming the second hole transporting layer 52 as described above, which will not be repeated here.

Figure 19:
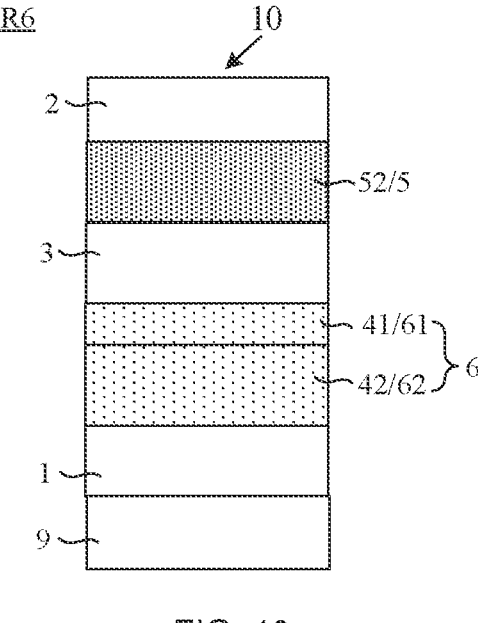

In the step R6, as shown in FIG. 19, the second electrode 2 is formed on a side of the hole transporting layer 5 away from the substrate 9.

For example, the second electrode 2 here is the anode. As for the description in which the second electrode 2 is the anode, reference may be specifically made to the step S1, which will not be repeated here.

It will be noted that the light-emitting device 10 formed in the embodiments as shown in FIG. 19 is a light-emitting device 10 with an inverted structure in which the electron transporting layer 4 is the carrier functional layer 6.

The light-emitting device 10 may be classified as a forward structure or an inverted structure in structure. The forward structure generally adopts conductive ITO as the anode, and then the hole injection layer, the hole transporting layer 5, the quantum dot light-emitting layer 3, the electron transporting layer 4 and the cathode are deposited in sequence. The inverted structure adopts ITO conductive glass as the cathode, the electron transporting layer 4 is directly deposited thereon, and then the quantum dot light-emitting layer, the hole transporting layer 5, the hole injection layer and the metal anode are deposited.

Figure 20:
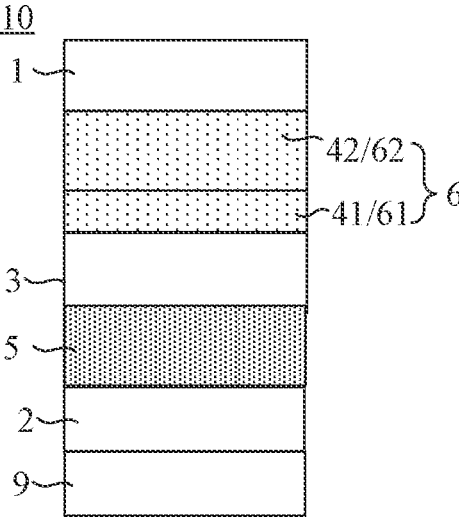
FIG. 20 is a structural diagram of yet another light-emitting device, in accordance with some embodiments of the present disclosure.
Figure 21:
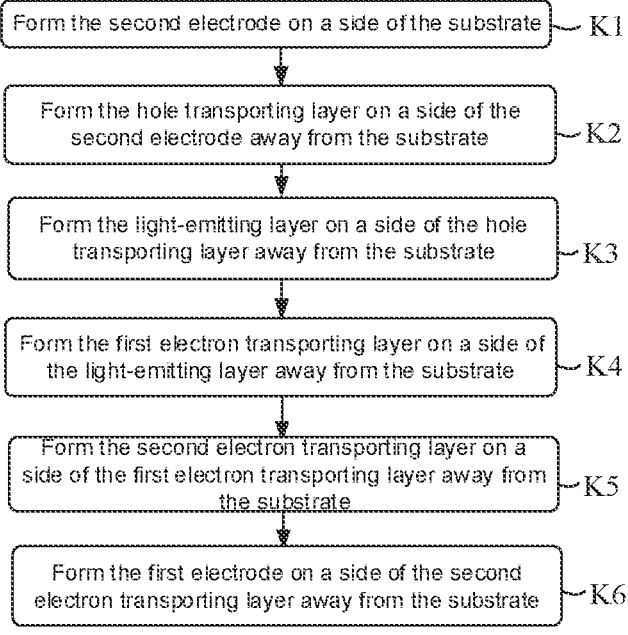
FIG. 21 is a flow diagram of another method of manufacturing a light-emitting device, in accordance with some embodiments of the present disclosure.

In some examples, as shown in FIG. 20, considering a light-emitting device 10 with a forward structure in which the carrier functional layer 6 is the electron transporting layer 4 as an embodiment, as shown in FIG. 21, forming the light-emitting device 10 includes steps K1 to K6.

In the step K1, the second electrode 2 is formed on a side of the substrate 9.

For example, the second electrode 2 is the anode.

As for the description in which the second electrode 2 is the anode, reference may be specifically made to the step S1, which will not be repeated here.

In the step K2, the hole transporting layer 5 is formed on a side of the second electrode 2 away from the substrate 9.

For example, the hole transporting layer 5 may be formed with reference to the step R5 as described above, which will not be repeated here.

In the step K3, the light-emitting layer 3 is formed on a side of the hole transporting layer 5 away from the substrate 9.

For example, as for the step, reference may be made to the description of forming the light-emitting layer 3 in the step S2, which will not be repeated here.

In the step K4, the first electron transporting layer 41 is formed on a side of the light-emitting layer 3 away from the substrate 9.

For example, in the step, the first electron transporting layer 41 containing the ligand material 7 (not shown in the figure) may be formed with reference to the steps S31a to S31b as described above.

In the step K5, the second electron transporting layer 42 is formed on a side of the first electron transporting layer 41 away from the substrate 9.

For example, as for the step, reference may be made to the description of forming the second electron transporting layer 42 in the step R2.

In the step K6, the first electrode 1 is formed on a side of the second electron transporting layer 42 away from the substrate 9.

For example, the first electrode 1 here is the cathode. As for the description in which the first electrode 1 is the cathode, reference may be specifically made to the step S1, which will not be repeated here.

Figure 22:
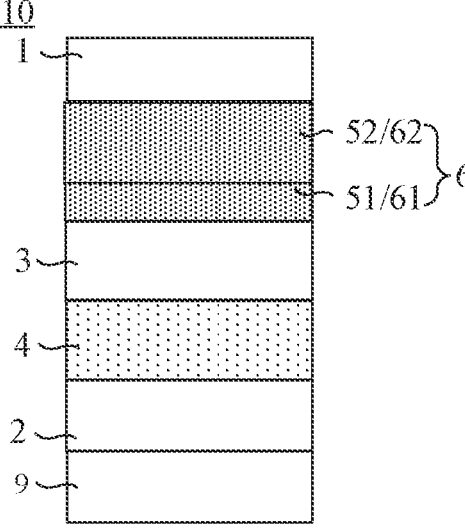
FIG. 22 is a structural diagram of yet another light-emitting device, in accordance with some embodiments of the present disclosure.

In some examples, as shown in FIG. 22, considering a light-emitting device 10 with an inverted structure in which the carrier functional layer 6 is the hole transporting layer 5 as an example, as shown in FIG. 23, forming the light-emitting device 10 includes steps M1 to M6.

In the step M1, the second electrode 2 is formed on a side of the substrate 9.

For example, the second electrode 2 is the cathode.

In the step M2, the electron transporting layer 4 is formed on a side of the second electrode 2 away from the substrate 9.

For example, the electron transporting layer 4 may be formed with reference to the steps S321 to S322 of forming the second electron transporting layer 42 as described above, which will not be repeated here.

In the step M3, the light-emitting layer 3 is formed on a side of the electron transporting layer 4 away from the substrate 9.

For example, as for the step, reference may be made to the description of forming the light-emitting layer 3 in the step S2, which will not be repeated here.

In the step M4, the first hole transporting layer 51 is formed on a side of the light-emitting layer 3 away from the substrate 9.

For example, in the step, the first hole transporting layer 51 may be formed with reference to the steps S31A to S31B as described above, which will not be repeated here.

In the step M5, the second hole transporting layer 52 is formed on a side of the first hole transporting layer 51 away from the substrate 9.

For example, in the step, the second hole transporting layer 52 containing the ligand material 7 (not shown in the figure) may be formed with reference to the steps S32A to S32B as described above, which will not be repeated here.

For example, as for the step, reference may be made to the steps S321' to S322' as described above. The second hole transporting layer 52 manufactured in the method contains no ligand material 7, which will not be repeated here.

In the step M6, the first electrode 1 is formed on a side of the second hole transporting layer 52 away from the substrate 9.

For example, the first electrode 1 is the anode.

Figure 25:
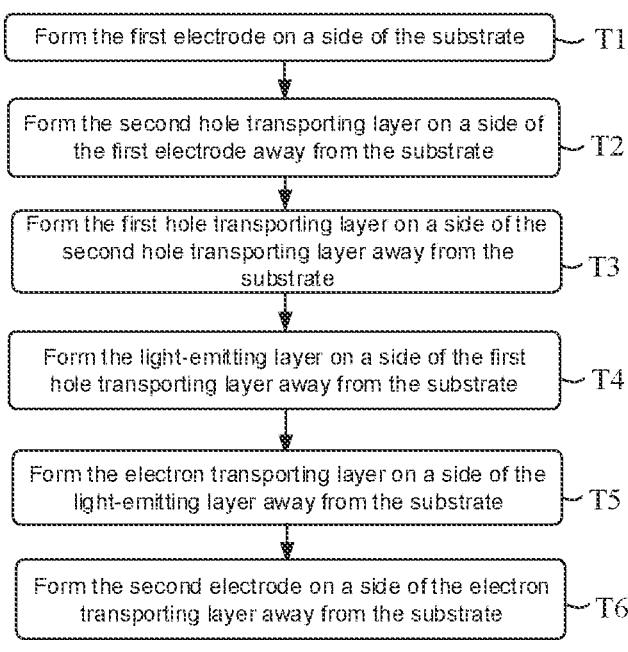
FIG. 25 is a flow diagram of yet another method of manufacturing a light-emitting device, in accordance with some embodiments of the present disclosure.

In some examples, as shown in FIG. 24, considering a light-emitting device 10 with a forward structure in which the carrier functional layer 6 is the hole transporting layer 5 as an example, as shown in FIG. 25, forming the light-emitting device 10 includes steps T1 to T6.

In the step T1, the first electrode 1 is formed on a side of the substrate 9.

For example, the first electrode 1 is the anode. As for the substrate 9 and the first electrode 1 that is the anode, reference may be made to the above description, which will not be repeated here.

In the step T2, the second hole transporting layer 52 is formed on a side of the first electrode 1 away from the substrate 9.

For example, in the step, the second hole transporting layer 52 containing the ligand material 7 (not shown in the figure) may be formed with reference to the steps S32A to S32B as described above, which will not be repeated here.

For example, as for the step, reference may be made to the steps S321' to S322' as described above. The second hole transporting layer 52 manufactured in this method contains no ligand material 7, which will not be repeated here.

In the step T3, the first hole transporting layer 51 is formed on a side of the second hole transporting layer 52 away from the substrate 9.

For example, in the step, the first hole transporting layer 51 containing the ligand material 7 (not shown in the figure) may be formed with reference to the steps S31A to S31B as described above, which will not be repeated here.

In the step T4, the light-emitting layer 3 is formed on a side of the first hole transporting layer 51 away from the substrate 9.

For example, as for the step, reference may be made to the description of forming the light-emitting layer 3 in the step S2, which will not be repeated here.

In the step T5, the electron transporting layer 4 is formed on a side of the light-emitting layer 3 away from the substrate 9.

For example, the electron transporting layer 4 may be formed with reference to the steps S321 to S322 of forming the second electron transporting layer 42 as described above, which will not be repeated here.

In the step T6, the second electrode 2 is formed on a side of the electron transporting layer 4 away from the substrate 9.

For example, the second electrode 2 here is the cathode. As for the description in which the second electrode 2 is the cathode, reference may be specifically made to the step S1, which will not be repeated here.

It can be seen from the above that the light-emitting device 10 in the embodiments of the present disclosure may be the light-emitting device 10 with the forward structure or the light-emitting device 10 with the inverted structure, which is not specifically limited thereto.

Steps for forming the first carrier functional layer 61 by a solution immersion method will be described below.

In some embodiments, as shown in FIG. 26, the step S31 of forming the first carrier functional layer 61 includes steps S311 to S312.

In the step S311, a third solution is formed, and any one of spin coating, ink jet printing and a sol-gel method is performed by using the third solution to form an initial first carrier functional layer 610; the third solution contains a host material for forming the first carrier functional layer 61, the third solution further contains a ligand material 7 bonded to atoms of the host material included in the third solution, and a mass fraction of a ligand material 7 of the initial first carrier functional layer 610 is equal to the mass fraction of the ligand material 7 of the second carrier functional layer 62.

For example, the mass fraction of the ligand material 7 of the initial first carrier functional layer 610 is equal to the mass fraction of the ligand material 7 of the second carrier functional layer 62, and the mass fractions of the ligand materials 7 may be each in a range from 0% to 40%, inclusive. For example, the mass fractions of the ligand materials 7 are each 20%, 30% or 40%.

It will be noted that the mass fractions of the ligand materials 7 may be both 0. That is, the initial first carrier functional layer 610 and the second carrier functional layer 62 may both contain no ligand material 7.

In the step S312, the initial first carrier functional layer 610 is immersed into a fourth solution to form the first carrier functional layer 61. The fourth solution is a solution containing a ligand material 7.

For example, the initial first carrier functional layer 610 is immersed into the fourth solution, and the immersion duration is, for example, in a range from 1 min to 10 min; and then, the immersed initial first carrier functional layer 610 is dried by tumbling or baking to form the first carrier functional layer 61. After the immersion, an amount of the ligand material 7 of the formed first carrier functional layer 61 is improved by 10% to 10 times than an amount of the ligand material 7 of the initial first carrier functional layer 610.

It will be noted that, in a case where the initial first carrier functional layer 610 contains the ligand material 7, the ligand material 7 of the initial first carrier functional layer 610 may be a hydrophilic ligand or a hydrophobic ligand, and a polarity of the ligand material 7 contained in the fourth solution may be different from a polarity of the ligand material 7 of the initial first carrier functional layer 610.

For example, the number of carbon atoms of the ligand material 7 contained in the fourth solution is in a range from 2 to 6.

For example, the number of carbon atoms of the ligand material 7 contained in the fourth solution is 2, 3, 4, 5 or 6.

In the ligand material 7, a ligand of which the number of carbon atoms is in a range from 2 to 6 is a short chain ligand, which has a relatively poor solubility and is prone to be separated from the immersion solution and bonded to a film layer immersed into the immersion solution.

In some examples, with continued reference to FIG. 26, the first carrier functional layer 61 formed in the steps S311 to S312 may be regarded as including two layers, i.e., a first first carrier functional layer 61a and a second first carrier functional layer 61b. The first first carrier functional layer 61a is farther away from the second carrier functional layer 62 than the second first carrier functional layer 61b. That is, the first first carrier functional layer 61a is closer to the light-emitting layer 3 (not shown in the figure, and a specific structure of which may be as shown in FIGS. 9a and 9b). The first first carrier functional layer 61a receives a relatively large amount of the ligand material 7 in the fourth solution, so that the mass fraction of the ligand material 7 of the first first carrier functional layer 61a is greater than the mass fraction of the ligand material 7 of the second first carrier functional layer 61b.

It will be understood that, of the first carrier functional layer 61 formed in the steps S311 to S312, the mass fraction of the ligand material 7 contained in the first first carrier functional layer 61a is greater than the mass fraction of the ligand material 7 contained in the second first carrier functional layer 61b; moreover, the mass fraction of the ligand material 7 contained in the second first carrier functional layer 61b is greater than the mass fraction of the ligand material 7 contained in the second carrier functional layer 62. In this way, the barrier of the carrier transportation is reduced, which is conducive to reducing the working voltage of the light-emitting device 10 and prolonging the service life of the light-emitting device 10.

In some examples, as shown in FIG. 19, considering the light-emitting device 10 with the inverted structure in which the carrier functional layer 6 is the electron transporting layer 4 as an example, the step R3 of forming the first electron transporting layer 41 on the side of the second electron transporting layer 42 away from the substrate 9 may be replaced by the steps S311 to S312 to form the first electron transporting layer 41. As for the formation processes of the first electrode 1, the light-emitting layer 3, the hole transporting layer 5 and the second electrode 2, reference may be respectively made to the steps R1, R4, R5 and R6, which will not be repeated here.

In some examples, as shown in FIG. 24, considering the light-emitting device 10 with the forward structure in which the carrier functional layer 6 is the hole transporting layer 5 as an example, the step T3 of forming the first hole transporting layer 51 on the side of the second hole transporting layer 52 away from the substrate 9 may be replaced by the steps S311 to S312 to form the first hole transporting layer 51. Here, the carrier functional layer 6 may be the hole transporting layer 5. As for the formation processes of the first electrode 1, the light-emitting layer 3, the electron transporting layer 4 and the second electrode 2, reference may be respectively made to the steps T1, T4, T5 and T6, which will not be repeated here.

Other steps for forming the first carrier functional layer 61 by a solution immersion method will be described below.

Figure 27:
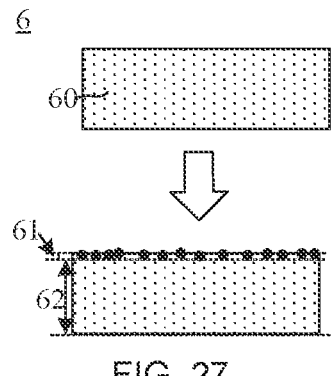
FIG. 27 is a diagram showing steps of manufacturing a carrier functional layer, in accordance with some other embodiments of the present disclosure.

In some embodiments, as shown in FIG. 27, the step S31 of forming the first carrier functional layer 61 includes:

forming an initial carrier functional layer 60; and immersing the initial carrier functional layer 60 into a fifth solution, so that a portion of the immersed initial carrier functional layer 60 forms the first carrier functional 61. The fifth solution is a solution containing a ligand material 7.

For example, as shown in FIG. 12, the carrier functional layer 6 is the electron transporting layer 4, the light-emitting device 10 is of an inverted structure, and the initial electron transporting layer 40 is obtained by magnetron sputtering. The initial carrier functional layer 60 is immersed into the fifth solution containing the ligand material 7, a portion of the initial electron transporting layer 40 to which the ligand material 7 is attached is referred to as the first electron transporting layer 41, the first electron transporting layer 41 contains the ligand material 7, and the second electron transporting layer 42 contains no ligand material 7, so that the purpose that the mass fraction of the ligand material 7 contained in the first electron transporting layer 41 is greater than that of the ligand material 7 of the second electron transporting layer 42. As a result, the function of adjusting the energy levels and the carrier mobilities of the first electron transporting layer 41 and the second electron transporting layer 42 is achieved.

It will be noted that, as for the structure of the light-emitting device 10 with the inverted structure in which the carrier functional layer 6 is the electron transporting layer 4, reference may be made to FIG. 12, and as for other steps, reference may be made to the steps R1 and R4 to R6, which will not be repeated here.

In some examples, as shown in FIG. 10, the carrier functional layer 6 is the electron transporting layer 4, the light-emitting device 10 is of an inverted structure, and the initial electron transporting layer 40 is obtained by the steps S32*a* to S32*b*. That is, the initial electron transporting layer 40 contains the ligand material 7. The initial electron transporting layer 40 is immersed into the fifth solution containing the ligand material 7, and the ligand material 7 contained in the immersion solution enters the initial electron transporting layer 40 by diffusion or exchange. Moreover, the closer to the immersion solution (the fifth solution), the more the concentration of the ligand material 7 is improved. It will be understood that the initial electron transporting layer 40 is divided into two layers, a portion of the initial electron transporting layer 40 with a relatively high concentration of the ligand material 7 is referred to as the first electron transporting layer 41, and the remaining portion of the initial electron transporting layer 40 is referred to as the second electron transporting layer 42. In this case, the mass fraction of the ligand material 7 of the first electron transporting layer 41 is greater than the mass fraction of the ligand material 7 of the second electron transporting layer 42.

It will be noted that, as for the structure of the formed light-emitting device 10, reference may be made to FIG. 10, and as for steps for forming other film layers, reference may be made to the steps R1 and R4 to R6, which will not be repeated here.

Figures 28, 29:
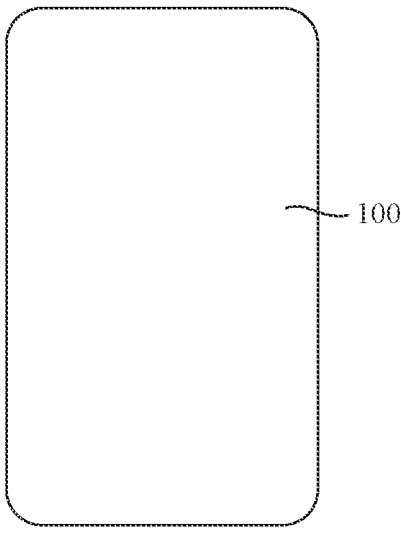
FIG. 28 is a structural diagram of a display substrate, in accordance with some embodiments of the present disclosure.
FIG. 29 is a structural diagram of a display apparatus, in accordance with some embodiments of the present disclosure.

Some embodiments of the present disclosure provide a display substrate 100. As shown in FIG. 28, the display substrate 100 includes the light-emitting device 10 as described above.

The display substrate 100 may be, for example, a QLED display substrate, a mini light-emitting diode (Mini LED) display substrate, a micro light-emitting diode (Micro LED) display substrate, etc.

Beneficial effects of the display substrate 100 are the same as beneficial effects of the light-emitting device 10 provided in the first aspect of the present disclosure, which will not be repeated here.

Some embodiments of the present disclosure provide a display apparatus 1000. As shown in FIG. 29, the display apparatus 1000 includes the display substrate 100.

The display apparatus 1000 provided in the embodiments of the present disclosure may be any apparatus that displays text or images whether in motion (e.g., a video) or stationary (e.g., a still image). More specifically, it is anticipated that the embodiments may be implemented in a variety of electronic apparatuses or associated with a variety of electronic apparatuses. The variety of electronic apparatuses include, but are not limited to, mobile phones, wireless apparatuses, personal digital assistants (PDAs), hand-held or portable computers, global positioning system (GPS) receivers/navigators, cameras, moving picture experts group 4 (MP4) video players, video cameras, game consoles, watches, clocks, calculators, television monitors, flat panel displays, computer monitors, automobile displays (e.g., odometer displays), navigators, cockpit controllers and/or displays, camera view displays (e.g., displays of rear-view cameras in vehicles), electronic photos, electronic billboards or signs, projectors, building structures, packaging and aesthetic structures (e.g., displays for displaying an image of a piece of jewelry), etc.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A light-emitting device, comprising:
a first electrode and a second electrode;
a light-emitting layer disposed between the first electrode and the second electrode; and
a carrier functional layer disposed between the first electrode and the light-emitting layer;
wherein the carrier functional layer includes a first carrier functional layer and a second carrier functional layer, the first carrier functional layer is closer to the light-emitting layer than the second carrier functional layer, the first carrier functional layer contains a host material and a ligand material, the second carrier functional layer contains a host material, and the host material of the first carrier functional layer and the host material of the second carrier functional layer include same atoms;
a mass fraction of the ligand material of the first carrier functional layer is greater than a mass fraction of a ligand material of the second carrier functional layer; and
the ligand material of the first carrier functional layer is a first ligand, the first ligand includes a first sub-ligand and a second sub-ligand, and a material of the first sub-ligand and a material of the second sub-ligand are different.

2. The light-emitting device according to claim 1, wherein the mass fraction of the ligand material of the second carrier functional layer is 10% to 80% of the mass fraction of the ligand material of the first carrier functional layer.

3. The light-emitting device according to claim 2, wherein the mass fraction of the ligand material of the first carrier functional layer is in a range from 5% to 50%; and
the mass fraction of the ligand material of the second carrier functional layer is in a range from 0.5% to 40%.

4. The light-emitting device according to claim 2, wherein the ligand material of the first carrier functional layer is a first ligand, the ligand material of the second carrier functional layer is a second ligand, and a polarity of the first ligand and a polarity of the second ligand are opposite; or
the ligand material of the first carrier functional layer is the first ligand, the ligand material of the second carrier functional layer is the second ligand, and the polarity of the first ligand and the polarity of the second ligand are opposite; a polarity of the light-emitting layer and the polarity of the first ligand are opposite.

5. The light-emitting device according to claim 1, wherein a polarity of the first sub-ligand and a polarity of the second sub-ligand are opposite.

6. The light-emitting device according to claim 5, wherein of the first carrier functional layer, a concentration of the ligand material contained in a side proximate to the light-emitting layer is greater than a concentration of the ligand material contained in a side away from the light-emitting layer.

7. The light-emitting device according to claim 6, wherein the ligand material of the second carrier functional layer is a second ligand, the material of the first sub-ligand and a material of the second ligand are the same, and the host material of the second carrier functional layer and the host material of the first carrier functional layer are the same.

8. The light-emitting device according to claim 7, wherein a mass fraction of the second sub-ligand of the first carrier functional layer and a mass fraction of the second ligand of the second carrier functional layer are equal; and/or the mass fraction of the second sub-ligand of the first carrier functional layer and the mass fraction of the second ligand of the second carrier functional layer are equal, and a number of carbon atoms of the first sub-ligand of the first carrier functional layer is in a range from 2 to 6.

9. The light-emitting device according to claim 1, wherein the mass fraction of the ligand material of the second carrier functional layer is 0; and/or the host material of the first carrier functional layer is nanoparticles, and a grain size of the nanoparticles is in a range from 3 nm to 5 nm.

10. The light-emitting device according to claim 1, wherein a ratio of a thickness of the first carrier functional layer to a thickness of the second carrier functional layer is in a range from 1:20 to 20:1; and/or the thickness of the first carrier functional layer is less than the thickness of the second carrier functional layer.

11. The light-emitting device according to claim 1, wherein the ligand material of the first carrier functional layer and the ligand material of the second carrier functional layer each include any one of an organic ligand and an inorganic ligand; and/or an energy level difference between the first carrier functional layer and the second carrier functional layer is greater than an energy level difference between the second carrier functional layer and the first electrode, and greater than an energy level difference between the first carrier functional layer and the light-emitting layer.

12. The light-emitting device according to claim 1, wherein the carrier functional layer is an electron transporting layer; the first carrier functional layer is a first electron transporting layer, and the second carrier functional layer is a second electron transporting layer;

a lowest unoccupied molecular orbital (LUMO) energy level of the ligand material is greater than a LUMO energy level of a layer for forming the electron transporting layer.

13. The light-emitting device according to claim 1, wherein the carrier functional layer is a hole transporting layer; the first carrier functional layer is a first hole transporting layer, and the second carrier functional layer is a second hole transporting layer; a highest occupied molecular orbital (HOMO) energy level of the ligand material is less than a HOMO energy level of a layer for forming the hole transporting layer; or the carrier functional layer is the hole transporting layer; the first carrier functional layer is the first hole transporting layer, and the second carrier functional layer is the second hole transporting layer; the HOMO energy level of the ligand material is less than the HOMO energy level of the layer for forming the hole transporting layer; the same atoms included in the host material of the first carrier functional layer and the host material of the second carrier functional layer are an oxygen atom, and any one of a nickel atom, a molybdenum atom, a tungsten atom, a vanadium atom and a zirconium atom.

14. A display substrate, comprising the light-emitting device according to claim 1.

15. A method of manufacturing a light-emitting device, comprising:

forming a first electrode and a second electrode;

forming a light-emitting layer between the first electrode and the second electrode; and forming a carrier functional layer located on a side of the first electrode;

wherein forming the carrier functional layer located on the side of the first electrode includes:

forming a first carrier functional layer; and forming a second carrier functional layer;

wherein the first carrier functional layer is closer to the light-emitting layer than the second carrier functional layer, the first carrier functional layer contains a host material and a ligand material, the second carrier functional layer contains a host material, the host material of the first carrier functional layer and the host material of the second carrier functional layer include same atoms, and a mass fraction of the ligand material of the first carrier functional layer is greater than a mass fraction of a ligand material of the second carrier functional layer;

wherein the ligand material of the first carrier functional layer is a first ligand, the first ligand includes a first sub-ligand and a second sub-ligand, and a material of the first sub-ligand and a material of the second sub-ligand are different.

16. The method of manufacturing the light-emitting device according to claim 15, wherein forming the second carrier functional layer includes:

forming the second carrier functional layer by magnetron sputtering; or forming a second solution; and performing any one of spin coating, ink jet printing and a sol-gel method by using the second solution to form the second carrier functional layer; wherein the second solution contains a host material for forming the second carrier functional layer, and a mass fraction of a ligand material contained in the second solution is greater than or equal to 0.

17. The method of manufacturing the light-emitting device according to claim 16, wherein forming the first carrier functional layer includes:

forming a first solution; and performing any one of spin coating, ink jet printing and a sol-gel method by using the first solution to form the first carrier functional layer; wherein the first solution contains a host material for forming the first carrier functional layer, the first solution further contains a ligand material, and the mass fraction of the ligand material of the first carrier functional layer is greater than the mass fraction of the ligand material of the second carrier functional layer; or forming a third solution; performing any one of spin coating, ink jet printing and a sol-gel method by using the third solution to form an initial first carrier functional layer; wherein the third solution contains a host material for forming the first carrier functional layer, the third solution further contains a ligand material, and a mass fraction of the ligand material of the initial first carrier functional layer is equal to the mass fraction of the ligand material of the second carrier functional layer; and immersing the initial first carrier functional layer into a fourth solution to form the first carrier functional layer; wherein the fourth solution is a solution containing a ligand material.

18. The method of manufacturing the light-emitting device according to claim 15, wherein forming the first carrier functional layer and the second carrier functional layer includes:

forming an initial carrier functional layer; and immersing the initial carrier functional layer into a fifth solution, so that a portion, proximate to the fifth solution, of the immersed initial carrier functional layer forms a first carrier functional layer, and another portion of the immersed initial carrier functional layer forms the second carrier functional layer;

wherein the fifth solution is a solution containing a ligand material.

19. A light-emitting device, comprising:

a first electrode and a second electrode;

a light-emitting layer disposed between the first electrode and the second electrode; and a carrier functional layer disposed between the first electrode and the light-emitting layer;

wherein the carrier functional layer includes a first carrier functional layer and a second carrier functional layer, the first carrier functional layer is closer to the light-emitting layer than the second carrier functional layer, the first carrier functional layer contains a host material and a ligand material, the second carrier functional layer contains a host material, and the host material of the first carrier functional layer and the host material of the second carrier functional layer include same atoms;

a mass fraction of the ligand material of the first carrier functional layer is greater than a mass fraction of a ligand material of the second carrier functional layer; and the carrier functional layer is an electron transporting layer; the first carrier functional layer is a first electron transporting layer, and the second carrier functional layer is a second electron transporting layer; and a lowest unoccupied molecular orbital (LUMO) energy level of the ligand material is greater than a LUMO energy level of a layer for forming the electron transporting layer.

20. The light-emitting device according to claim 19, wherein the same atoms included in the host material of the first carrier functional layer and the host material of the second carrier functional layer are an oxygen atom and a zinc atom; or the same atoms included in the host material of the first carrier functional layer and the host material of the second carrier functional layer are the oxygen atom and the zinc atom; at least one of the first carrier functional layer and the second carrier functional layer further includes a dopant atom, and the dopant atom includes at least one of magnesium, aluminum, zirconium, hafnium and yttrium.

* * * * *